(12) United States Patent
Caywood

(10) Patent No.: US 6,201,732 B1
(45) Date of Patent: Mar. 13, 2001

(54) LOW VOLTAGE SINGLE CMOS ELECTRICALLY ERASABLE READ-ONLY MEMORY

(76) Inventor: John M. Caywood, 1410 Wright Ave., Sunnyvale, CA (US) 94087

( * ) Notice: Subject to any disclaimer, the term of this patent is extended or adjusted under 35 U.S.C. 154(b) by 0 days.

(21) Appl. No.: 09/499,254

(22) Filed: Feb. 2, 2000

Related U.S. Application Data

(60) Division of application No. 09/207,287, filed on Dec. 8, 1998, now abandoned, which is a continuation-in-part of application No. 08/890,415, filed on Jul. 9, 1997, now Pat. No. 5,986,931, which is a continuation-in-part of application No. 08/778,315, filed on Jan. 2, 1997, now Pat. No. 5,790,455.

(51) Int. Cl.$^7$ ............................................ G11C 11/34
(52) U.S. Cl. ............................ 365/185.05; 365/185.28; 365/185.06
(58) Field of Search .................... 365/185.06, 185.27, 365/185.23, 185.22, 185.11, 185.08, 149, 185.05, 185.28

(56) References Cited

U.S. PATENT DOCUMENTS

| | | | |
|---|---|---|---|
| 4,115,914 | 9/1978 | Harari | 29/571 |
| 4,203,158 | 5/1980 | Frohman-Bentchkowsky et al. | 365/185 |
| 4,209,849 | 6/1980 | Schrenk | 365/182 |
| 4,399,523 | 8/1983 | Gerber et al. | 365/218 |
| 4,477,825 | 10/1984 | Yaron et al. | 357/23.5 |
| 4,479,203 | 10/1984 | Kuo | 365/218 |
| 4,558,344 | 12/1985 | Perlegos | 357/59 |
| 4,616,339 | 10/1986 | Cuppens et al. | 365/185 |
| 4,672,580 | 6/1987 | Yau et al. | 365/189 |
| 4,701,776 | 10/1987 | Perlegos et al. | 357/23.5 |
| 5,295,096 | 3/1994 | Nakajima | 365/185 |
| 5,404,329 | 4/1995 | Yamagata et al. | 365/189.09 |
| 5,418,390 * | 5/1995 | Wang | 257/321 |
| 5,430,675 | 7/1995 | Yajima et al. | 365/189.01 |
| 5,490,107 | 2/1996 | Akaogi et al. | 365/185.22 |
| 5,568,421 | 10/1996 | Aritome | 365/185.17 |
| 5,587,945 | 12/1996 | Lin et al. | 365/185.1 |
| 5,636,160 | 6/1997 | Omino et al. | 365/185.02 |
| 5,666,307 | 9/1997 | Chang | 365/185.03 |
| 5,687,118 | 11/1997 | Chang | 365/185.19 |
| 5,706,227 | 1/1998 | Chang et al. | 365/185.18 |
| 5,723,355 | 3/1998 | Chang et al. | 437/56 |
| 5,736,764 | 4/1998 | Chang | 257/318 |
| 5,773,861 | 6/1998 | Chen et al. | 257/316 |
| 5,854,502 * | 12/1998 | Nishihara | 257/321 |

FOREIGN PATENT DOCUMENTS

| | | | |
|---|---|---|---|
| 0778623 | 10/1986 | (EP) | H01L/29/788 |
| 0440265 | 1/1988 | (EP) | G11C/17/00 |
| 02959235 | 6/1988 | (EP) | G11C/17/00 |
| 0347093 | 6/1989 | (EP) | G11C/17/00 |
| 0776049 | 11/1996 | (EP) | H01L/29/788 |
| 287321 | 7/1985 | (TW) | |

OTHER PUBLICATIONS

International Electron Devices Meeting 1988: San Francisco, CA; IEEE 88CH2528–8, IEDM Technical Digest.

(List continued on next page.)

Primary Examiner—A. Zarabian
(74) Attorney, Agent, or Firm—Steven F. Caserza; Flehr Hohbach Test Albritton & Herbert LLP

(57) ABSTRACT

P channel EEPROM cells are designed for integration into arrays written with single polarity signals developed from small, low power charge pumps. These cells reduce the additional masking steps that must be added to a CMOS logic process for EEPROM to only one additional step. The novel cells of this invention enable the array to function with a $V_{PP}$ about 2 V less than that required by an N channel EEPROM cell, with similar writing speed and tunnel oxide thickness.

22 Claims, 23 Drawing Sheets

OTHER PUBLICATIONS

Ohnakado, T. et al., "Novel Electron Injection Method Using Band–to–Band Tunneling Induced Hot Eelctron (BBHE) for Flash Memory with a P–channel Cell", *IEEE IEDM95–279*, pp. 11.5.1–11.5.4 (1995).

Gerber, B. and Fellrath, J. "Low–Voltage Single Supply CMOS Electrically Erasable Read–Only Memory", *IEEE*, vol. ED–27, No. 7, pp 1211–1216 (Jul. 1980).

Yeargain, J and Kuo, C, "A High Density Floating–Gate EEPROM Cell", *IEEE IEDM*, 2.2 (1981).

Johnson, W., et al., session XII: *ROMs, PROMs and EROMs, THPM 12.6: A 16kb Electrically Erasable Non-volatile Memory*, IEEE International Solid–State Circuit Conferenece (1980) pp 152–153.

*New Design Technology for EEPROM Memory Cells with 10 Million Write/Erase Cycling Endurance* by Shirota et al., IEDM 89–599, CH–2637–7/89 from IEEE.

*Erratic Erase in ETOX Flash Memory Array* by Ong et al., Intel Corporation RN3–01.

*Failure Mechanisms of Flash Cell in Program/Erase Cell in Program/Erase Cycling* by Cappelletti et al. IEDM 94–291, CH–07803–2111 (1994) IEEE.

*Flash EPROM disturb Mechanisms* by Dunn et al., CH–3332–4/94 (1994) IEEE/IRPS.

*Extended Data Retention Process Technology for Hightly Reliable Flash EEPROMS of $10^6$ to $10^7$ W/E Cycles* by Arai et al., IEEE 98 CH–36173 36th Annual International Reliability Physics Symposium, Reno, Nevada CH–07803–440 06/98 (1998) IEEE.

Gerber, B., et al., *A 1.5 Single–Supply One–Transistor CMOS EEPROM*, IEEE (Jun. 1981) pp 195–200.

\* cited by examiner

LOW VOLTAGE SINGLE CMOS ELECTRICALLY ERASABLE READ-ONLY MEMORY

RELATED APPLICATIONS

This continuation application claims priority to application(s) Ser. No(s). Divisional patent application Ser. No. 09/207,287; filed Dec. 8, 1998, now abandoned, continuation-in-part patent application Ser. No. 08/890,415; filed Jul. 9, 1997; now issued U.S. Pat. No. 5,986,931; issued on Nov. 16, 1999; and continuation-in-part application Ser. No. 08/778,315; filed Jan. 2, 1997; now issued U.S. Pat. No. 5,790,455; issued on Aug. 4, 1998.

BACKGROUND

1. Field of the Invention

This invention pertains to electronic memories and in particular to nonvolatile memory cells and cell organization suitable for operation with byte alterability of the nonvolatile information stored in the memory.

2. Prior Art

There is a long history of nonvolatile memory devices and more particularly electrically erasable programmable read only memory (EEPROM) devices. All prior art commercial byte alterable EEPROMs have used N channel devices as the memory transistor. Such an N channel EEPROM cell 10 typical of current technology is shown in the top view of FIG. 1a and the cross section of FIG. 1b.

As shown in FIG. 1a there are two layers of polycrystalline silicon 13 and 14 formed on and insulated from silicon substrate 24. The cell includes select transistor 29 and memory transistor 28. The substrate under memory transistor 28 is doped P type except where locally doped N type to form source/drain regions 16 and 23. The first layer of polycrystalline deposited is called poly 1. The poly 1 feature 14 has no connections to other conductors and is therefore referred to as a floating gate. This portion of the poly 1 layer forms the gate of memory transistor 28. The second layer of polycrystalline silicon, called poly 2, is used to form a transistor 29, having polycrystalline silicon gate 12, that acts as a select transistor between contact 19 and memory transistor 28. Poly 2 layer is also used to form control gate 13 of memory transistor 28, which is capacitively coupled to floating gate 14.

N type region 15 is located under a thin tunnel oxide window 11. Region 15 is used during programming and erasing. (In this application, the IEEE standard 1005 will be followed consistently for nomenclature. Therefore, programming is defined as putting electrons onto the floating gate and erasing is defined as removing electrons from the floating gate.) There is also a buried diffusion 17 on the source side of the memory transistor 28. This is included merely so that the channel length is not alignment sensitive and could be omitted without loss of functionality. The buried diffusions are so called because they lie under the polycrystalline silicon layers. (In some designs they also lie under the field oxide.) Thick field oxide 18, which exists outside of the "T" shaped region of thin oxide bounded by the heavy lines in FIG. 1a, provides isolation between the transistors and the N type diffusions where desired. The regions under field oxide 15 may have enhanced P type doping relative to the regions under the gates in order to raise the threshold voltages of the parasitic field transistors.

Typical operation will have floating gate 14 charged positively with respect to ground when erased and charged negatively with respect to ground when programmed. To read memory transistor 28, control gate 13 is grounded and gate 12 of select transistor 29 is biased positively to provide a low resistance path from its drain contact 19 to drain 15 of memory transistor 28. Drain contact 19 provides connection to metal bit line 25 as is seen in the cross section view of FIG. 1b (the metal is omitted from the top view of FIG. 1a in the interests of clarity). Bit line 25 is biased at a modest positive voltage (e.g. 2 V) and the common source line 16 is biased at ground. If floating gate 14 is erased, current can flow from bit line 25 to source region 16. If floating gate 14 is programmed, memory transistor 28 is in a nonconducting state and no current flows. The presence or absence of current flow is sensed to determine the state stored by memory transistor 14.

The oxide in tunnel window 11 is typically about 10 nm thick. To program memory cell 28, floating gate 14 must be capacitively coupled to a sufficiently positive potential with respect to drain 15 that a field of about 10 MV/cm appears across tunnel oxide 11. This is accomplished by biasing poly 2 control gate 13 at about 20 V while biasing select gate 12 at a sufficiently high potential that select transistor 29 is conducting with bit line 25 at ground potential. Under these conditions, drain region 15 provides a source of electrons on the cathode side of tunnel oxide 11. With 10 MV/cm appearing across tunnel oxide 11, Fowler-Nordheim tunneling occurs and charges floating gate 14 negatively.

To erase memory transistor 28, the bias across tunnel oxide 11 must be reversed. This is accomplished by applying a high bias to drain 15 of memory transistor 28 while poly 2 control gate 13 is biased at ground in order to keep control gate 13 capacitively coupled to a low voltage. The high voltage is applied to drain 15 of memory transistor 28 by applying the desired voltage to bit line 25 while gate 12 of select transistor 29 is biased at a potential that is higher than the desired voltage by at least the threshold voltage of select transistor 29.

The operation of this cell in an array can be understood with reference to FIGS. 2a and 2b, which shows a portion of a prior art memory array 38 including a single word line 31 and associated bit lines 32-0 through 32-7, thereby forming a portion of a memory capable of storing a single 8 bit word. (In this and subsequent schematic drawings, the transistor gate with a small notch directed at the channel region is used indicate a transistor in which one portion of the gate oxide has been thinned to enhance the tunneling current.) To write a desired data pattern into a word, all bits of the word are first programmed and then selected bits are erased to achieve the desired pattern. Selection of the word to be programmed is achieved with the combination of word line 31 and word line select transistor 37 in FIG. 2b. A high voltage, $V_{PP}+V_{TN}$, where $V_{PP}$ is a positive programming voltage (typically approximately 18 volts) and $V_{TN}$ is the threshold voltage of an N channel transistor (typically approximately 4 volts with 18 V of source bias), is applied to word line 31 to select the desired row of the memory array. $V_{PP}$ is applied to column 35 associated with the desired word. This voltage passes through word select transistor 37 to the control gates 34-0 through 34-7 of all of the transistors in the word to be programmed. During this program operation all bit lines are biased at $V_{SS}$. After all of the floating gates in the selected word are programmed, $V_{SS}$ (ground) is applied to line 35 and $V_{PP}$ is applied to those bit lines 32-0 through 32-7 containing bits that are to be erased, while the bit lines containing bits that are not to be erased remain biased at $V_{SS}$.

There is a convenient consequence of this particular sequence of writing operations. Because all transistors in the selected word are initially programmed, they are in a non-conducting state when their control gates are grounded by applying $V_{SS}$ to line 35. When $V_{PP}$ is applied to the selected bit lines, the floating gates of the selected transistors are erased into a conducting state and the common source line 35 is charged up. However, the voltage on the common source line is limited to Vfg-$V_{TN}$, where Vfg is the floating gate potential and $V_{TN}$ is the threshold of the memory transistor when neutralized by extended exposure to ultraviolet light. This moderate voltage is too small to punch through the programmed transistors and so no current flows from the bit lines that are biased at $V_{PP}$ to those that are biased at $V_{SS}$. It is this lack of direct current path that makes it possible to operate commercial EEPROMs from a single logic level power supply with all of the needed high voltages being generated on the chip by relatively small, low power charge pumps.

There are a couple of features of this prior art that limit its desirability for application in integrated circuit products in which only a small number of EEPROM bits are desired in a circuit that is primarily logic or a mixed signal product. The prior art cell depicted in FIGS. 1*a* and 1*b* has at least three additional masking steps that are not required for the fabrication of an MOS structure containing logic circuitry but not containing EEPROM cells: the second layer of polycrystalline silicon, the thin tunnel oxide window, and the buried N region under the polycrystalline silicon floating gate. These masking steps and the processes associated with them add cost to the manufacturing process, perhaps as much as 20% to the cost of manufacturing a CMOS wafer. This is a high price to pay for functionality that is only used in a small portion of the product when only a small number of EEPROM bits are required. To reduce this cost, there have been a number of single poly EEPROM cells developed. This reduces somewhat the cost of adding EEPROM functionality to a circuit, but is still more expensive than is really desirable because of the continuing need for the additional processing steps associated with forming the tunnel oxide window and the diffusions 15 and 17.

A second hindrance to incorporating EEPROM technology into existing CMOS processes is the relatively high voltages required for the write operation. An electric field of about 10 MV/cm across the tunnel oxide is required for a sufficiently large Fowler-Nordheim tunneling current to write to a cell in times measured in msec. In addition, not all of the voltage applied to the control gate is coupled to the floating gate. In practical cases, the capacitive coupling ratio between the control gate and the floating gate is in the range 0.6 to 0.8 (i.e. 60 to 80% of voltage applied to the control gate is coupled to the floating gate). This means that $V_{PP}$ greater than about 12 V is required between the control gate and the tunneling diffusion in the substrate. To achieve this a voltage which was earlier expressed as ($V_{PP}$+$V_{TN}$) must be applied to the row line. The $V_{TN}$ in this equation is not the usual threshold voltage measured with the body of the N channel transistor grounded; rather this voltage threshold is the voltage threshold with the body of the transistor at $-V_{PP}$ as a result of the voltage on its source. When $V_{PP}$ is approximately 12 V, the threshold voltage can easily be increased as a result of the body effect to about 3 V. This results in a voltage of at least about 15 V being applied to the word line. Many logic processes will not reliably support a voltage of this magnitude.

SUMMARY OF THE INVENTION

In accordance with the teachings of this invention, these limitations are alleviated by reducing the magnitude of the applied voltage required for writing and by simplifying the fabrication process, thereby reducing manufacturing costs. To accomplish these ends, P channel EEPROM cells have been developed. These cells are designed for integration into arrays that can be written with single polarity signals that can be developed from relatively small, low power charge pumps that can be integrated into the integrated circuit products. These cells reduce the additional masking steps that must be added to a CMOS logic process for EEPROM to only one additional step in some embodiments. Furthermore, the novel cells of this invention enable the array to function with a value of $V_{PP}$ that is about 2 V less than that required by an N channel EEPROM cell of the prior art, with similar writing speed and tunnel oxide thickness.

Among the advantages of this invention are that it has the potential for significantly decreasing the development time and cost because it makes less stringent demands on the high voltage capability of the process and that it can decrease the cost for processing a wafer by 3 to 5%.

The focus of this invention is developing P channel EEPROM cells that can be integrated into arrays and supported with on chip circuitry so that the array is suitable for inclusion into an integrated circuit that is to function from a single voltage power supply. For use in practical array it is necessary to have cells that can be set into states to represent an arbitrary pattern of ones and zeroes. In the conventional N channel EEPROM, this is accomplished by programming all of the bits within a word and then erasing selected bits to establish a defined pattern within the array. There are select transistors so that words that are not intended to be written are isolated from the high voltages used for programming and erasure.

This invention includes three methods for performing these functions in a P channel array. In a first method, the cells within a word are all programmed, i.e. electrons are injected onto the floating gates, and then selectively erased. Because a P channel MOSFET with a gate negatively charged is in the conducting mode, a transistor is provided between the floating gate and the source in all of the cells in order to allow isolation of the cells form the common source during the selective erase. If the cells are connected through a common source during the erase, current will flow from the drain of the cell or cells that are to be erased to the drain(s) of those cell(s) that are not to be erased. Such a current would load any practicable on chip charge pumps such that the voltage applied to the drains to be erased would be limited to a low enough value that erasure would not occur. Adding a source select transistor allows current flow through the floating gate transistor to the source to be inhibited during the erase mode, but enabled during the read mode to provide a sense current.

A second method of operation described in this invention functions by erasing all bits within a word and then selectively programming those that are to be in the programmed state. With this method all the cells in a word can share a common source line. The selective programming is accomplished by providing a select transistor to the capacitor that controls the potential on the floating gate. This select transistor provides for matrix addressing of the control capacitor on a bit by bit basis.

In an alternative embodiment, a tunneling window under the floating gate is not used, but rather the entire gate area of the memory transistor lies over a thin tunnel oxide region. This allows a shorter channel length, a simpler fabrication process, and therefore a lower cost device. This approach has the further advantage that the memory transistor provides more read current for a given floating gate potential.

In another embodiment of this invention, individual source select transistors in each cell are not required. In this embodiment, a separate source line is run through the array for each column so that a shared source select transistor is used to provide the necessary isolation for all of the memory transistors on a column. In this manner, a substantial decrease in array area is achieved. In another embodiment, the source and drain select transistors are omitted. The cell is programmed by biasing the control gate to a high voltage with the N well at ground and other nodes either floating or at ground. The selected cells are erased by biasing the bit lines of the selected cells at VPP while the biases applied to the other cells in the array are such that the voltage across the gate oxide is maintain at a low enough voltage that significant tunneling does not occur.

DETAILED DESCRIPTION OF THE INVENTION

Figure 3:
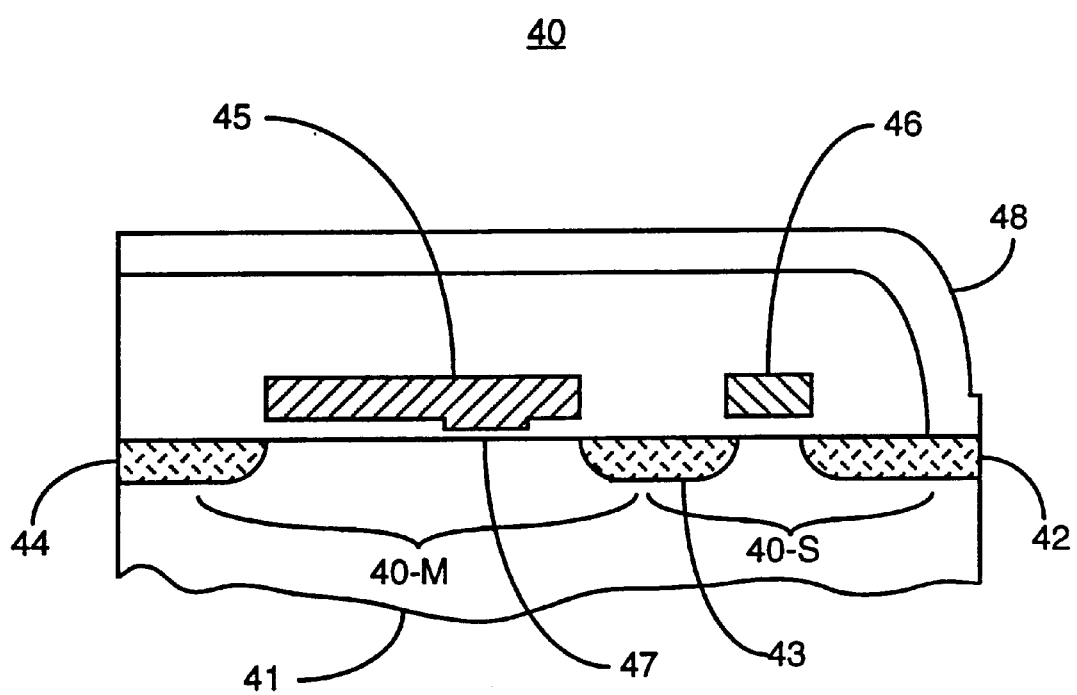
FIG. 3 is a cross sectional view through a portion of an EEPROM cell in accordance with one embodiment of the present invention.

A cross section through a portion of a P channel EEPROM memory cell in accordance with one embodiment of this invention is shown in FIG. 3. Cell 40 is fabricated in N well (or N type substrate) 41 into which P regions 42, 43, and 44 are located to form the sources and drains of P channel MOS transistors. The cross section is through two transistors; the polycrystalline silicon regions 46 and 45 form the gates of these two transistors. Shown is memory transistor 40-M with gate 45, drain 43 and source 44, and select transistor 40-S with gate 46, drain 42 and source 43. To program memory transistor 40-M, gate 45 is capacitively coupled to a high positive potential while N well 41 under the memory and select devices is grounded. Gate 46 of select transistor 40-S and bit line 48 are also grounded. This causes an accumulation region to form in N well 41 under floating gate 45. There is a thin oxide region 47 between floating gate 45 and N well 41. The electric field resulting from the potential between floating gate 45 and the accumulation layer across thin oxide 47 causes electrons to tunnel from the accumulation layer to floating gate 45, thereby programming memory transistor 40-M. To erase memory transistor 40-M, N well 41 is biased at $V_{PP}$ and $V_{PP}$ is applied to bit line 48. Gate 46 is grounded and floating gate 45 is capacitively coupled to a low voltage. Since gate 46 of the select transistor 40-S is turned on hard, diffusion 43 is biased at $V_{PP}$ and an inversion layer forms under floating gate 45. If node 44 is floating, the potential of the inversion layer will also be at $V_{PP}$. The resultant electric field across thin oxide 47 causes electron tunneling from floating gate 45 to the inversion region in N well 41. This causes floating gate 45 of memory transistor 40-M to be erased.

This embodiment of the present invention has two features that are advantageous for cases in which a small number of EEPROM bits are integrated into a circuit that is primarily intended to perform a logic or mixed signal function. Notice that because the body of memory transistor 40-M is N type, an additional diffusion under the tunnel oxide window is not needed, unlike the prior art of FIG. 1. This simplifies the manufacturing process. In an embodiment of FIG. 3 in which memory cell 40 is laid out using only one layer of polycrystalline silicon, this P channel embodiment of the present invention requires only one masking operation beyond that required for a CMOS logic fabrication process. Depending upon the scale of the process, the additional mask may be used either to form a thin oxide tunnel window in a process that has a relatively thick gate oxide for the logic transistors (e.g. a 1 micron minimum feature size logic or mixed signal process might have gate oxide thickness of approximately 20 nm) or to form a thick gate oxide for the select and high voltage switching transistors in a process with gate oxide for the logic transistors that is thin enough to be used for the Fowler-Nordheim tunnel oxide. For example, a logic process with minimum gate lengths in the range of 0.4 to 0.5 microns might have gate oxides in the range of 9–10 nm. This oxide could be used for the Fowler-Nordheim tunnel oxide, but transistors with gate oxide thickness in the range of 20 nm are required for the select and switching transistors that control the high voltages used for the program and erase functions. A second advantage is that because select transistor 40-S is a P channel device, voltage in excess of $V_{PP}$ is not required on the gate of select transistor 40-S for writing. When select transistor 40-S is to pass voltage, its gate is set to ground. This allows the full $V_{PP}$ voltage used for erasing the cell to pass from the bit line to the drain of memory transistor 40-M.

Figure 4:
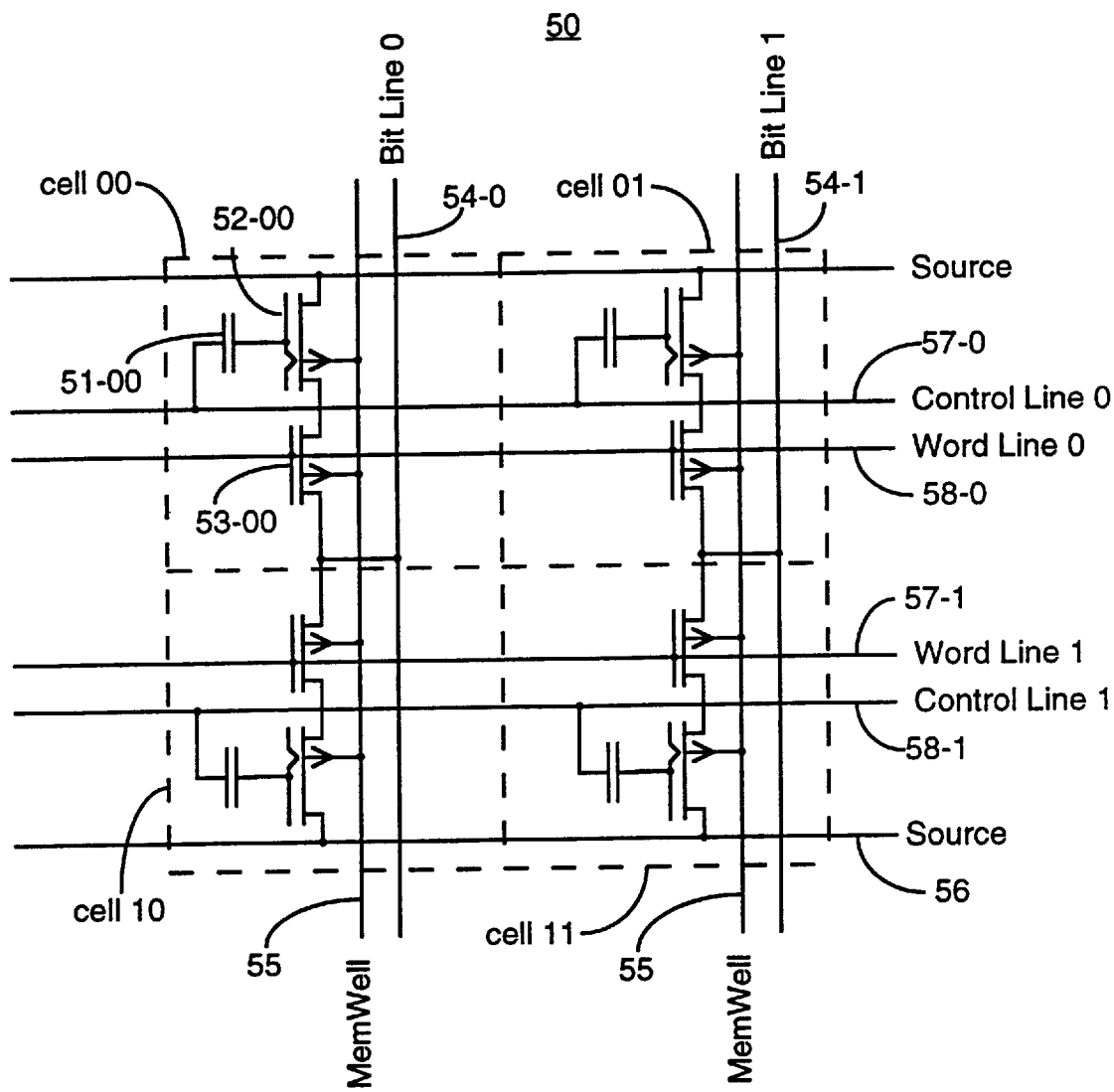
FIG. 4 is a schematic diagram illustrating a problem with simply transferring the array used for the conventional N channel EEPROM to a P channel implementation.

While the embodiment of FIG. 3 is useful in a number of circumstances, there is, however, a problem which can be seen by considering FIG. 4. Shown in FIG. 4 is a 2×2 array 50 of cells composed of the portion seen in FIG. 3 with the addition of coupling capacitor 51. The cells on row 0 can be programmed by biasing control line 0 at $V_{PP}$ with all of the other signals at ground as discussed in the previous paragraph. Consider what happens if the cell connected to row 0 and bit line 0, hereafter referred to as cell 00, is to be erased while cell 01 is to remain programmed. Following the approach described in the previous paragraph, the memory wells are biased at $V_{PP}$ and word line 0 and control line 0 are grounded. (Word line 1 would be biased at $V_{PP}$ to isolate row 1 from the voltages applied to the bit lines.) Because the cell on bit line 1 is to remain programmed, bit line 1 should be grounded. Bit line 0 is biased at $V_{PP}$. The inversion layer that forms under memory transistor 52-00 to cause erasure means that memory transistor 52-00 is conducting, which causes source 0 to charge towards $V_{PP}$. With control line 0 grounded to erase cell 00, memory transistor 52-01 is biased in the conducting state also, as is select transistor 53-01 of cell 01. This provides a current path from bit line 0 to bit line 1 through the two cells and the common source. This current would be large enough to load significantly any practical charge pump integrated into the integrated circuit containing this array. This current is very undesirable. The balance of this disclosure is concerned with alleviating this and other limitations that arise in implementing a P channel EEPROM cell in an array.

Figure 5:
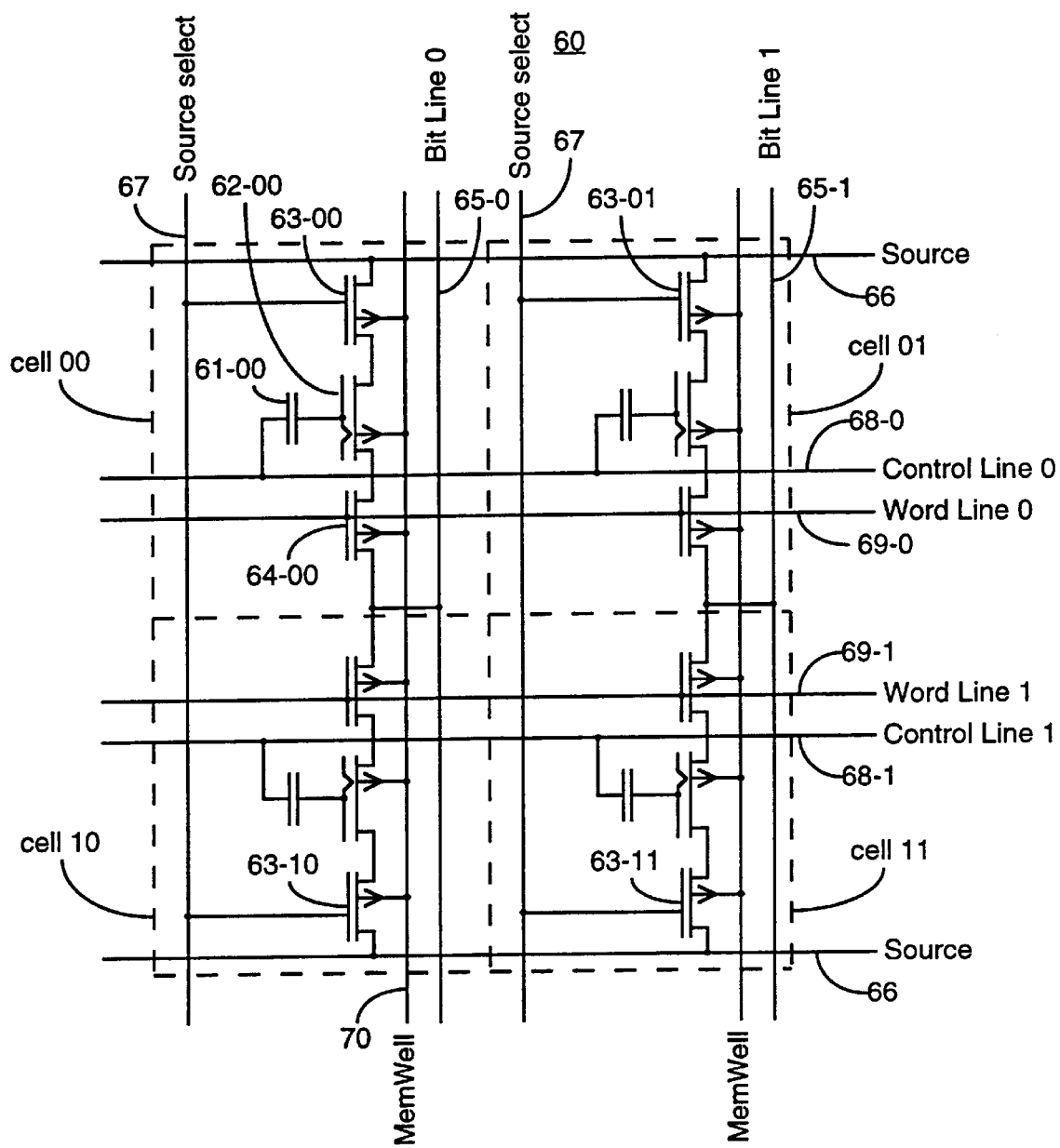
FIG. 5 is a schematic diagram of several cells in accordance with one of the embodiments of this invention embedded in a small array.

FIG. 5 shows schematically one embodiment of a 2×2 array 60 of memory cells that illustrates one embodiment of this invention which prevents an undesirable current path through the common source. Source select transistors 63-00 through 63-11 At have been added in each respective cell 00 through 11. It is desirable to minimize the number of control signals that must be applied to a memory array. Therefore, in the preferred embodiment it will be assumed that all of the source select transistors gates are connected in common to simplify the periphery circuitry, although this is not necessary. The gates of the source select transistors of the unselected cells could be biased at other voltages without adversely affecting operation of the array. In the read mode, the gates of the source select transistors 63-00 through 63-11 are grounded, which allows any row to be selected with row select transistors 64-00 through 64-11 via word lines 69-0 and 69-1. In the erase mode, the gates of the source select transistors should all be biased at $V_{PP}$ to isolate the memory transistors 62-00 through 62-11 from the common source lines 66-1 and 66-2. In the program mode, the bias on source select transistors 63-00 through 63-11 is not critical; we choose to bias them at ground for the sake of simplicity, but they could equally well be biased at $V_{DD}$ or $V_{PP}$ without adversely affecting the programming operation.

The operation of the array-shown schematically in FIG. 5 is shown in Table 1. In the read mode, the entry under word line indicates that the word line in at 0 for the selected row and $V_{DD}$ for the deselected row. In a similar fashion the double entries in the other modes are to read as the voltages applied to the selected and deselected nodes in that order.

TABLE 1

|  | Read | Program | Erase |
| --- | --- | --- | --- |
| Control line | $V_{DD}$ | $V_{PP}$ (selected) 0 (deselected) | 0 |
| Word line | 0 (selected) $V_{DD}$ (deselected) | 0 | 0 (selected) $V_{PP}$ (deselected) |
| Bit line | $V_{DD}$ −1.5 V | 0 | $V_{PP}$ (selected) 0 (deselected) |
| Source select | 0 | 0 | $V_{PP}$ |
| Source | $V_{DD}$ | float | float |
| Memory N well | $V_{DD}$ | 0 | $V_{PP}$ |

Figure 6B:
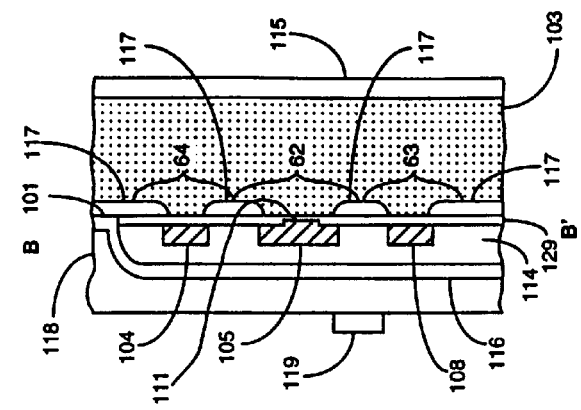
FIGS. 6a and 6b are cross section views, showing the structure of one embodiment of the cell shown schematically in FIG. 5.
Figure 6:
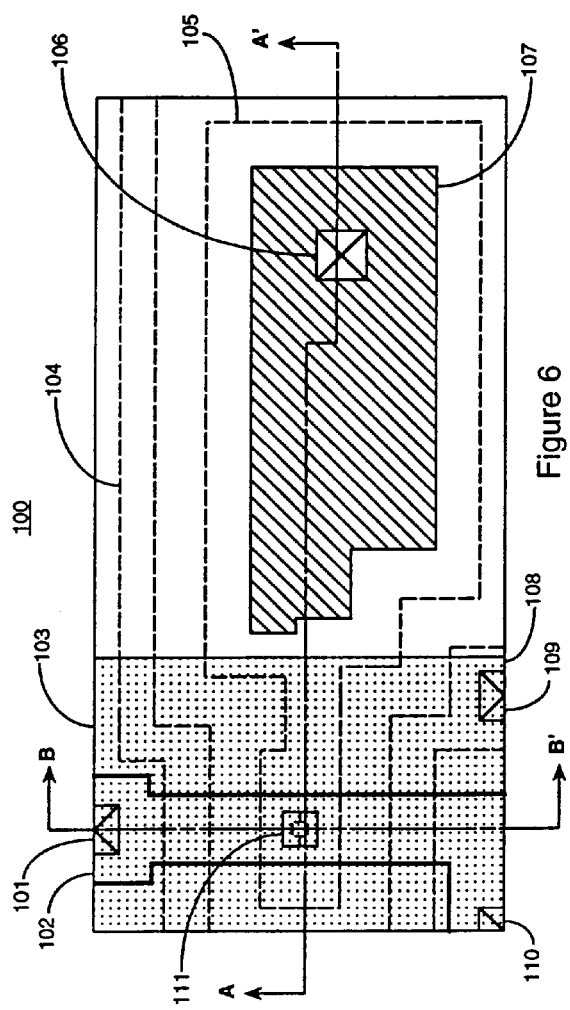
FIG. 6 is a top view.

FIG. 6 shows a layout of one embodiment of one of the memory cells shown schematically in FIG. 5 implemented in a typical non-self aligned double polycrystalline silicon process. Such processes are commonly used, for example, in the manufacture of mixed signal integrated circuits where they are employed for switched capacitor circuits.

Figure 6A:
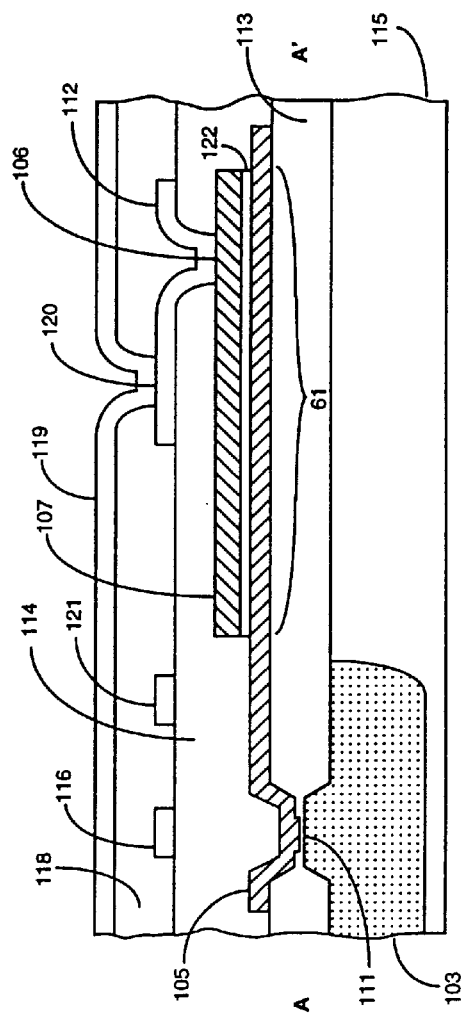

FIG. 6 shows a top view of a cell 100 and FIGS. 6A and 6B show two cross sectional views through cell 100. There is an N well 103 in which an active region 102 lies. In the fabrication of a typical modern CMOS integrated circuit, the doping for the N wells and P wells is typically introduced into the substrate and then a thin layer of silicon dioxide topped with a layer of silicon nitride is formed on the wafer surface. Through a series of photolithographic and etching steps, the nitride is removed in the regions where it is desired-to form a thick oxide that will serve to isolate active elements that are formed in the substrate, such as transistors, diffused interconnection regions, and resistors. After the selective nitride removal, thick field oxide 113 is grown. Field oxide is typically in the range. 0.3 μm to 1.5 μm thick. The nitride blocks diffusion of the oxidizing species in the areas that remain covered. These covered regions are referred to as the active regions. The areas on which the thick oxide is grown may have the surface concentration of the dopant enhanced prior to oxidation to raise the threshold voltage of parasitic thick field transistors that will subsequently be inherently formed, as is known in the art.

After field oxide 113 is grown, the nitride is removed and a thin layer of silicon dioxide 129, typically in the thickness range of 10 nm to 100 nm, is formed. This oxide will serve as the gate oxide. In the case that a thin tunneling oxide is desired, the gate oxide is grown only partially. An operation involving photolithography and etching selectively removes the oxide from the regions that should have the thin oxide and the thin tunnel oxide 111 is then formed in these regions. While the thin oxide is formed in the tunneling regions, gate oxide 129 is thickened to the desired value. Tunnel oxide 111 is usually in the range of 5 nm to 20 nm in thickness. Poly-crystalline silicon is then formed to a thickness in the range of 150 nm to 800 nm and doped. Lithographic and etching steps are used to form the polycrystalline silicon into the desired shapes. In FIG. 6, this first layer of polycrystalline silicon forms gate 104 of word line select transistor 64, gate 105 of memory transistor 62, and gate 108 of source select transistor 63. The first layer of polycrystalline silicon also may form capacitor plates, interconnects and resistors, if desired.

In a double layer polycrystalline silicon fabrication process, insulating layer 122, typically either silicon dioxide or a multi-layer sandwich of silicon dioxide/silicon nitride/silicon dioxide, is formed on the first layer of polycrystalline silicon. This layer is usually in the range of thickness of 20 nm to 100 nm. Then a second layer of polycrystalline silicon is deposited, doped and patterned. In FIGS. 6 and 6a, capacitor plate 107 is formed in this manner. After the second layer of polycrystalline silicon is patterned, source/drain regions 117 are implanted with the polycrystalline silicon gates serving as masks for protecting the channel regions.

Finally a layer of dielectric is formed and holes are selectively etched through it to allow contact to be made to the substrate diffusions and the polycrystalline silicon layers. In FIGS. 6, 6a and 6b, these contacts are shown with reference numerals 101, 106, 109 and 110. A layer of conductor, usually aluminum or an aluminum alloy in the range of 0.5 to 1.5 μm thick, is deposited and patterned to form interconnections. This conducting layer is referred to as metal 1 in the balance of this description. In the cell of FIG. 6B, metal 1 is used to form bit line 116. The two metal layers 116 and 119 and inter-metal contact are omitted from the top view of FIG. 6 in the interests of clarity. Metal 1 is also used to form the connections for the source and source select. Source select trace 121 runs vertically in the top view of FIG. 6 and can also be seen in the cross section of FIG. 6A. The source connection also runs vertically in the top view. However, both the source select and the source connection are shared between two adjacent cells. The source select trace is seen in cross section in FIG. 6A, but the source connection is not seen because it runs in the adjacent cell. Metal 1 is also provided where it is desired to make a connection from a polycrystalline silicon layer or diffusion in the substrate to the second level of metal. An example of this is seen as metal 1 interconnect 112 in the cross section of FIG. 6A.

After the first layer of metal is deposited and patterned, another layer of dielectric is formed and holes are selectively etched to allow connections from the second layer of metal, metal 2, to the first layer of metal. One of these metal vias is shown as via 120 in the cross section of FIG. 6A. This layer of dielectric is typically 0.5 μm to 2.0 μm thick. Metal 2 is deposited and patterned to form interconnections, typically in the thickness range 0.5 μm to 2.0 μm. This layer is shown as layer 119 in the cross sections of FIGS. 6A and 6B. This trace is used to route the control line through the cell in the horizontal direction in FIG. 6.

As seen in the top view of FIG. 6, word line select transistor 64 is formed at the intersection of polycrystalline silicon trace 104 and active region 102, memory transistor 62 is formed at the intersection of polycrystalline silicon trace 105 and active region 102, and source select transistor 63 is formed at the intersection of polycrystalline silicon trace 108 and active region 102. Control capacitor 61 is formed by the overlap of polycrystalline silicon island 107 and polycrystalline silicon region 105. Word line 69-0 is routed through the cell in the horizontal direction by polycrystalline silicon trace 104.

It is to be understood that the process described here is just by way of example and not intended to limit the scope of the invention. The process can be modified in a number of ways by those with ordinary skill in the art, in light of the teachings of this invention. For example, select transistors 63 and 64 could be formed using the second layer of polycrystalline silicon as their gates.

Figure 7:
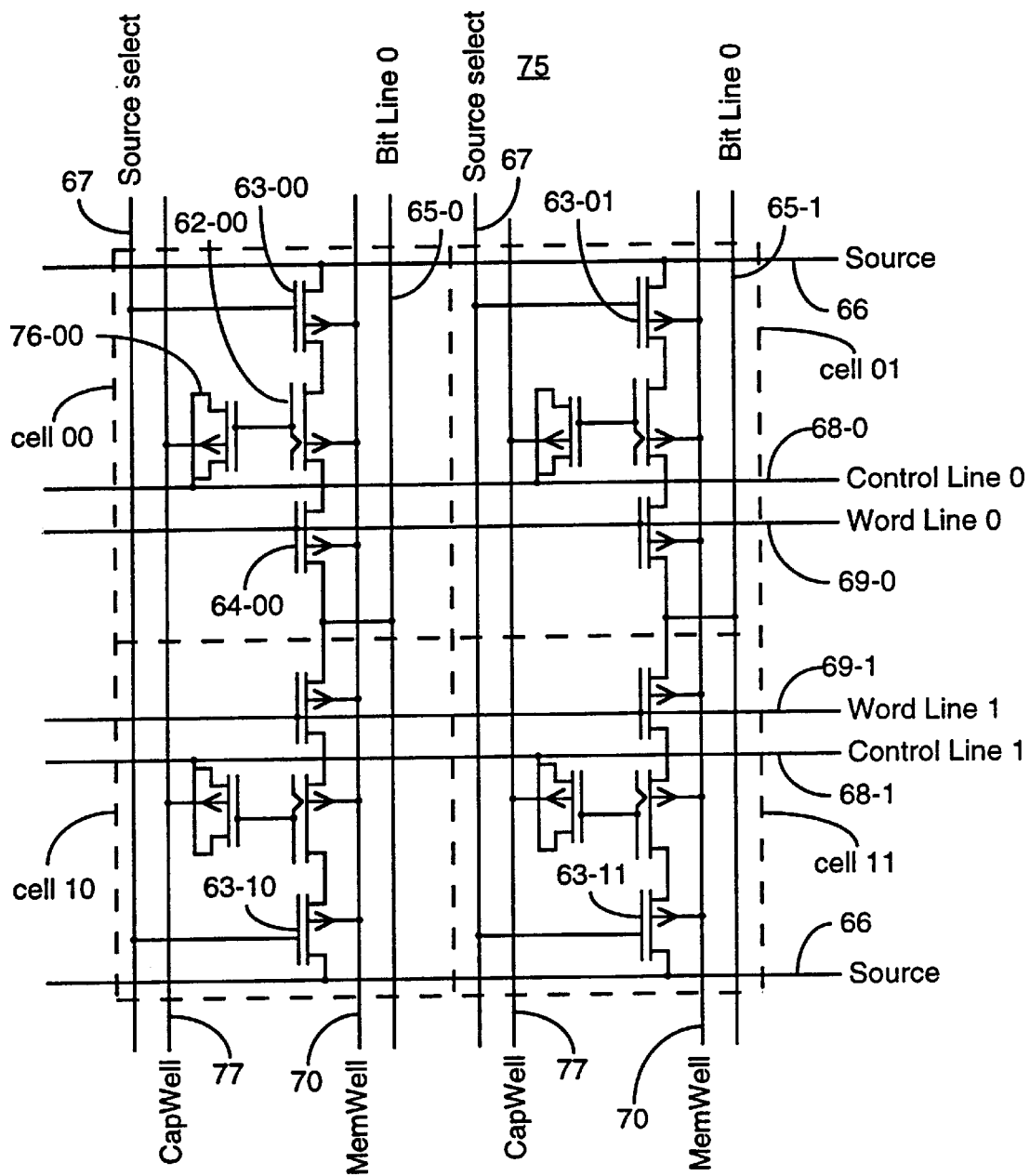
FIG. 7 is a schematic diagram of another embodiment of an array in accordance with the teachings of this invention.

In logic circuits and some mixed signal environments, only a single level of polycrystalline silicon is used. It is desirable, therefore, to design a cell that can be implemented in such a single poly process. FIG. 7 shows the schematic diagram of one embodiment of an array of cells that implements a P channel EEPROM in a single layer polycrystalline silicon environment in accordance with this invention. In this embodiment a P channel transistor with common source and drain 142 is used to implement the control capacitor.

In the read mode, the N wells are all biased at $V_{DD}$, the gates of the source select transistors 63-00 through 63-00 are grounded via line 67 and control lines 68-0 and 68-1 are biased at $V_{DD}$. In various alternative embodiments, each memory cell is contained in its own well region, or well regions are shared among a variety of cells along a word line, along a bit line, or a group of cells spread over more than one bit and/or word line. The selected word line, e.g. word line 69-0 when row 0 is selected, is biased at ground ($V_{SS}$) and the selected bit lines, 65-0 and 65-1 are typically biased at a moderate voltage (e.g. $V_{DD}$-1.5 V) to allow the state of the selected cells to be sensed. The unselected word lines are biased at $V_{DD}$ to isolate the unselected cells from the bit lines and the unselected bit lines are usually allowed to float to avoid current consumption in unselected columns. The unselected bit lines could be biased at $V_{DD}$ at the expense of extra circuitry. Of interest, the bit line must be biased at a value less than $V_{DD}$. The minimum value (i.e. the most negative value) is set by the requirement that the hot electron generation rate be low enough that it not disturb the cell. Since a conducting cell is programmed (i.e. charged negative), it is possible that the bit line could be biased at ground.

Table 2 shows the operational voltages of the array shown schematically in FIG. 7. As in the previous table, in the cases in which there are double entries the first value is associated with the selected line.

TABLE 2

|  | Read | Program | Erase |
|---|---|---|---|
| Word line | 0 (selected) | 0 (selected) | 0 (selected) |
|  | $V_{DD}$ (deselected) | $V_{PP}$ (deselected) | $V_{PP}$ (deselected) |
| Bit line | $V_{DD}$ −1.5 V | 0 | $V_{PP}$ (selected) |
|  |  |  | 0 (deselected) |
| Source select | 0 | 0 | $V_{PP}$ |
| Source | $V_{DD}$ | float | float |
| Memory N well | $V_{DD}$ | 0 | $V_{PP}$ |
| Control line | $V_{DD}$ | $V_{PP}$ (selected) | 0 |
|  |  | 0 (deselected) |  |
| Capacitor well | $V_{DD}$ | $V_{PP}$ | 0 |

To program this array, memory wells containing the memory transistors and the select transistors are grounded via lines 70. The N wells containing capacitors 76-00 through 76-11 are biased at V$_{PP}$. Control line 68-0 for the selected row 0 is biased at V$_{PP}$ and the control lines of all the unselected rows are biased at ground. This capacitively couples a high voltage onto the floating gates of the memory cells contained in the selected row (or word). To emphasize the similarity with the embodiment of FIG. 5, those elements that are common to the two schematics are numbered similarly. Only those elements that differ, MOS capacitor 76 and capacitor wells 77, are numbered differently.

The control lines can be decoded to allow word wide programming as is known in the art and as was described for the typical prior art N channel array. Alternatively, for those applications in which word writeability is not required, the select transistors can be omitted to save space.

To erase cell 00 at row 0 bit line 0 of the array, memory N well line 70 is biased at V$_{PP}$, and capacitor wells 77 and control lines 68-0 and 68-1 are biased at ground. This holds the floating gates coupled to a low potential. The selected word line 69-0 is biased at ground and the unselected word line 69-1 is biased at V$_{PP}$. Then V$_{PP}$ is applied to the selected bit line 65-0 to erase the selected memory transistor. In one embodiment, all word lines and all bit lines are held at ground while the bias of the memory wells is increased to V$_{PP}$ in order to establish inversion layers at ground under the floating gates, so that the holes in these inversion layers will shield the floating gates from the fields that would otherwise be established to the memory wells. The unselected word lines are then be biased at V$_{PP}$ before V$_{PP}$ is applied to the selected bit lines to erase the selected cells.

Figure 8:
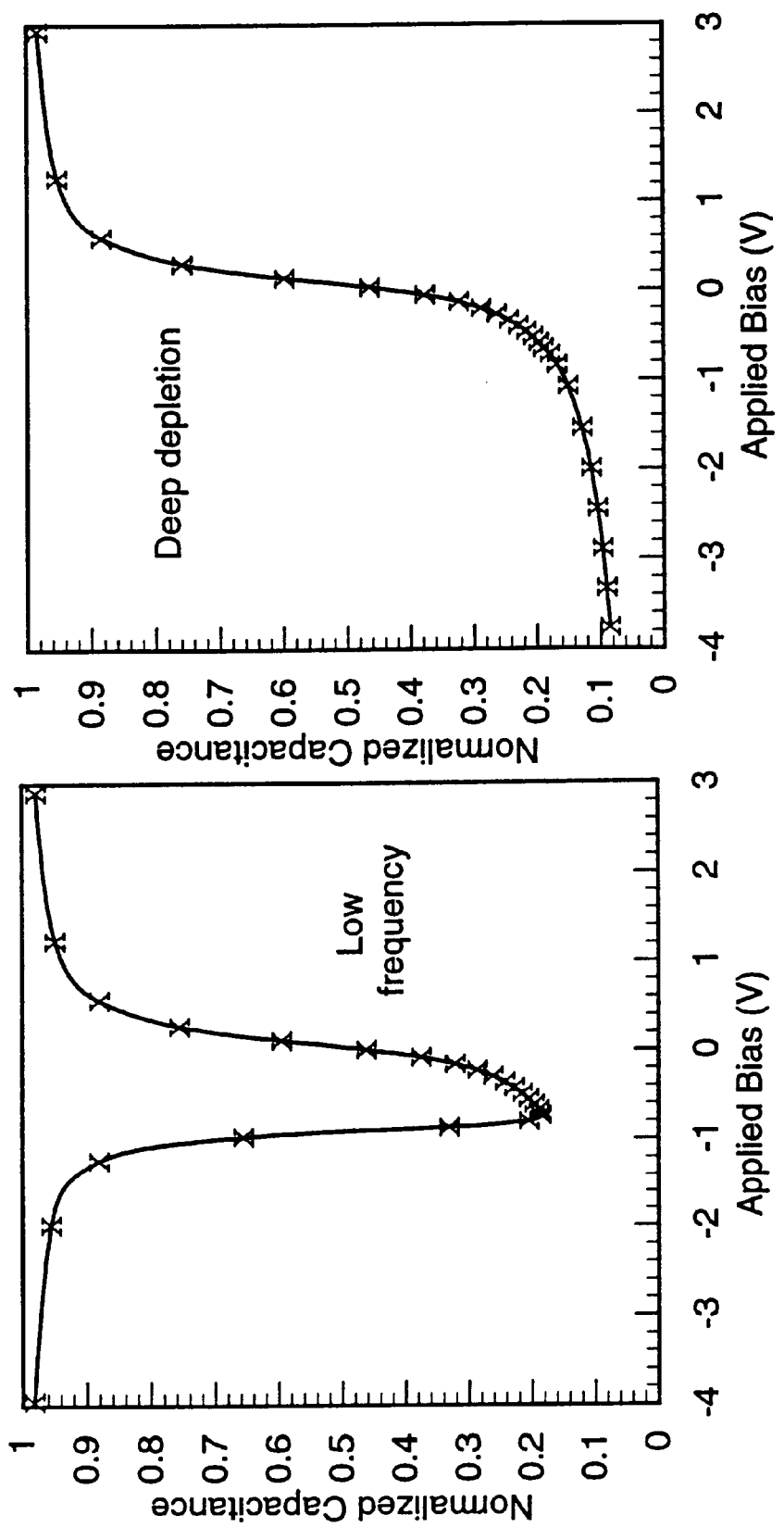
FIG. 8 shows plots of the dependence of the capacitance on the voltage applied to the gate for a MOS capacitor for the cases of equilibrium and deep depletion.

The behavior of the unselected rows during the programming mode requires some discussion. MOS capacitors with relatively lightly doped substrates are voltage variable (i.e. the capacitance depends upon the relative bias between the capacitor polycrystalline silicon gate and the capacitor body lying under the polycrystalline silicon). The capacitance also depends upon the bias on adjacent doped regions that may act as sources or sinks for mobile carriers. FIG. 8 shows the calculated capacitance as a function of potential between the capacitor body and the capacitor gate for a MOS capacitor with a N type body doped to $1\times10^{16}$ atoms/cm$^3$ and an oxide thickness of 200 Å. The capacitance is normalized to the capacitance of the oxide between two conductors. The curve labeled "Low frequency" is that which will occur when the capacitor has a source of holes to supply carriers for inversion. The curve labeled "Deep depletion" is that for the case in which there is no source of carriers available.

For both cases, biasing the body more than about a volt positive with respect the gate results in the capacitor being in accumulation (i.e. a layer of electrons from the capacitor body is "accumulated" near the oxide interface with the result that the capacitance will be nearly that of an oxide sandwiched between two conductors). As the bias is reduced the electrons are pushed away from the surface and a layer that is "depleted" of electrons is formed between the oxide an the mobile carriers in the body. This depletion layer appears as a capacitor in series with the oxide capacitance and the total series capacitance decreases. If there is a source of holes, they will be collected at the surface when the surface potential is low enough and the capacitance will be that between the layer of mobile holes and the polycrystalline silicon plate. This capacitance will approach that of the oxide at low enough bias. This is referred to as "inversion" because the surface behaves as if it were P type (i.e. as if the type of the surface is inverted). The case with inversion is called the low frequency case. If there is no source of mobile charge, the depletion layer becomes continuously wider and the capacitance continuously decreases. This is the deep depletion case.

If an unselected bit is programmed prior to the potential of the capacitor wells being increased to V$_{PP}$, there will be an inversion layer under the capacitor gate. This means that there will be a relatively large capacitance between the gate and the P+ source/drain diffusion which is fixed at ground. Therefore, the voltage on the floating gate will not change because the capacitor plate is shielded from the changing well potential by the inversion layer. As the well becomes increasingly positive the inversion layer shrinks until it disappears and the capacitor goes into deep depletion. (The shrinkage of the inversion layer with increased reverse body bias is what leads to the increase in transistor threshold.) In deep depletion the gate is coupled the body, but, as is clear from FIG. 8, the capacitance is relatively small so the capacitive coupling to the floating gate is not increased in voltage by very much and there is not much voltage across the tunnel oxide for the programmed cells.

If, on the other hand, a cell is erased, there is initially an accumulation layer under the polycrystalline silicon gate if both control line and capacitor well are at ground. This accumulation capacitance will couple the floating gate up in voltage so there is real reason for concern that the unselected erased cells will be "disturbed" by electrons tunneling to the gate because of the potential across the tunnel oxide resulting from the coupling to the capacitor well. The final voltage across the tunnel oxide of the unselected erased cell resulting from the well bias depends upon its original potential before the well bias is increased. The more positive the original voltage on the unselected erased floating gate, the larger the final oxide field.

It is illustrative to work through an example to see how this happens. Let us assume that the coupling ratio of the MOS capacitor to the floating gate is 0.8 when the capacitor is strongly accumulated (i.e. that the floating gate voltage changes 0.8 V for every change of 1 V on the well). We assume that the transition from accumulation to inversion occurs when the gate is 0.3 V more positive than the body and that the transition from depletion to inversion occurs when the gate is −0.7 V more negative than the body. This is the case illustrated in FIG. 8 and is a fairly typical set of numbers. It is assumed that the floating gate is initially at +1 V and the well and source/drain diffusions (control line) are at ground. As the well increases in voltage, the floating gate voltage also increases, but more slowly. For simplicity in this illustration, it is assumed that the MOS capacitor has the oxide capacitance until the gate/body difference reaches the 0.3 V accumulation threshold and then decreases to 10% of that value. Since the source/drain are maintained at ground, there is no source of holes and the capacitance curve will follow the deep depletion case. This is a crude, but reasonably accurate, approximation.

The accumulation threshold is attained at the well bias given by $$V_{init} - V_{accum} = (1 - \text{coupling\_ratio})V_{N\ well}$$

Evaluating this expression shows that the accumulation threshold is reached when the N well voltage is 3.5 V. For N well voltages greater than this, the coupling ratio is reduced to ⅓. If V$_{PP}$ is chosen to be 11 V, the final floating gate voltage for this unselected erased cell is 6.3 V. This is high enough that there could be a small amount of tunneling over many cycles. Fortunately, the maximum voltage across the tunnel oxide decreases much faster than the initial voltage. If we assume that after some large number of programming events on other cells in the array the initial voltage is decreased by 0.1 v to 0.9 V, the same calculation shows that the final floating gate voltage is 6 V. Because the Fowler-Nordheim current decreases exponentially with the voltage applied across the tunnel oxide, this decrease in voltage will decrease the disturb current by almost an order of magnitude.

More detailed analysis shows that the final voltage on the floating gate depends strongly on the initial floating gate voltage and that the final voltage changes much more rapidly than the initial voltage for those initial floating gate voltages in the range that the final voltage is not limited by tunneling. Even if tunneling occurs, only a small amount of charge is transferred prior to reducing the floating gate potential to a level where tunneling current is substantially decreased, because of the small total capacitance of the floating gate with the control capacitor in depletion ($\Delta Q = C \Delta V$). Therefore, the disturb tends to be self limiting; enough charge will be transferred to lower the potential on the erased gate to the point that the disturb is insignificant. The initial potential at which the disturb becomes insignificant is that about equal to the onset of depletion (e.g. about +0.5 V for the case illustrated here.) Because this cell has a row select transistor, it will operate quite well with a programmed voltage as low as the transistor inversion (conduction) threshold voltage, e.g. −0.7 V. To avoid significant disturb, the initial programmed level can be controlled by periodically interrupting the program function and monitoring the maximum program voltage in ways well known in the art, such as is described in V. N. Kynette et al., "An In-system Reprogrammable 256 k CMOS Flash Memory", ISSCC Digest, 1988 pp. 132–3. If the maximum threshold level is set to not exceed +1 V, the cell can easily tolerate a range of programmed bits of 1 V. If the array is programmed a word at a time, this tolerance is relatively easy to maintain. Even for an array that is to be programmed a row at a time, this tolerance is very reasonable for small arrays.

Figure 9:
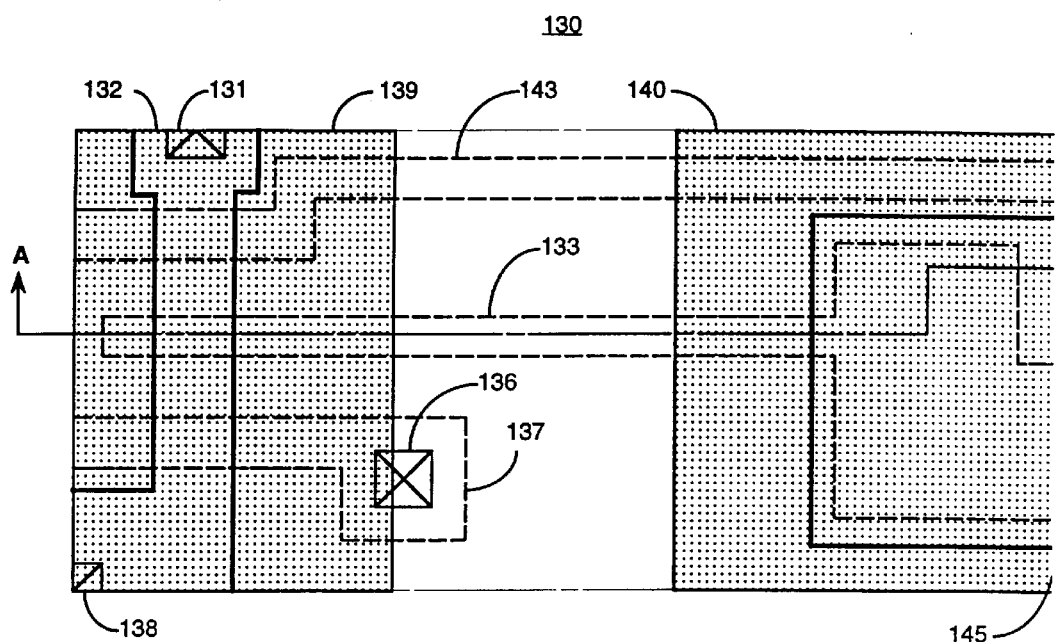
FIG. 9 is a top view and FIG. 9a is a cross section view showing one embodiment of a single one of the memory cells shown schematically in FIG. 7.
Figure 9A:
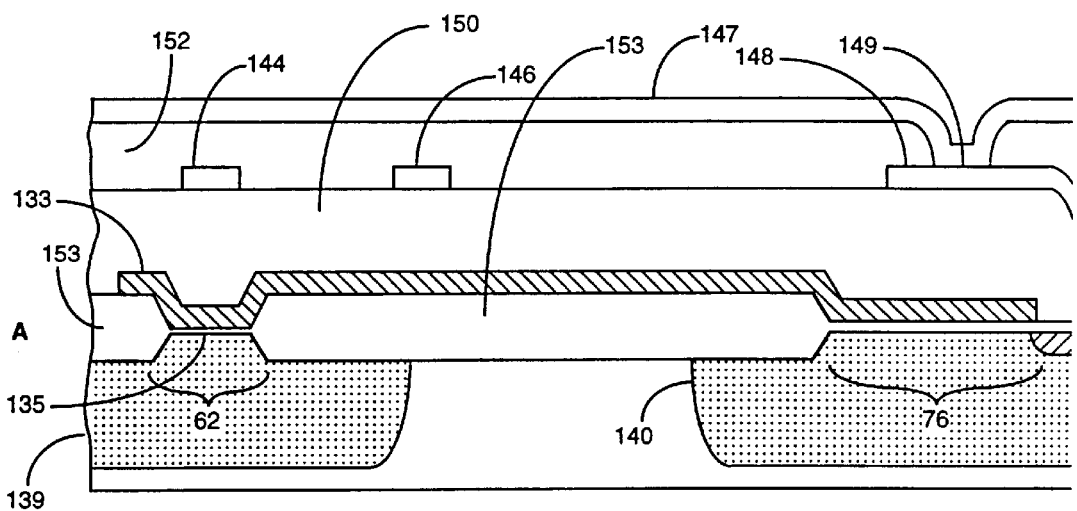

FIG. 9 shows the top view of one embodiment of a memory cell of this invention laid out in accordance with the schematic diagram shown in FIG. 7. FIG. 9A shows a cross section through the cell in the horizontal direction. A vertical cross section through the memory transistor is the same as is shown in FIG. 6B. This cell is laid out in a single poly, double metal process. This is an N well process fabricated in a P type substrate 151 in which the N wells for the memory and select transistors 139 and the control capacitors 140 are embedded. Polysilicon layer 133 forms the gate of memory transistor 62 and the gate of MOS control capacitor 76. The polysilicon trace 137 forms the gate for the source select transistor for both this cell and for the adjacent cell (not shown). The polysilicon trace 143 forms the word select gate for the cell and also routes the word line through the array. The metal 1 line 144 forms the bit line and contacts the drain of the word select transistor at the contact 131. This line, and all of the other metal lines and intermetal vias, are omitted from the top view in the interest of clarity. The metal 1 line 146 serves as the source select line and connects the gate of the source select transistor at the contact 136. The bottom plate of the control capacitor 76 is formed in the active region 145 where the polysilicon overlaps the capacitor N well 140. The P+ diffusion 142 surrounds the capacitor everywhere that the polysilicon doesn't overlap the active region. This polysilicon layer provides a source of holes under the correct bias conditions as discussed previously. Control line 147 runs through the cell horizontally in metal 2 and contacts the P+ diffusion 142 through the intermediary of metal 1 line 148 and internal via 148. Regions of thick field oxide 153, typically 0.3 to 1.2 $\mu$m thick, define the boundaries of the active regions and cause the parasitic field transistors to have high enough thresholds that they do not conduct. The thickness of the field oxide also serves to reduce the capacitance of the floating gate over the field regions. A relatively thick, typically 0.5 $\mu$m to 1.5 $\mu$m thick, dielectric layer 150 separates metal 1 layer from the polysilicon layer. Another relatively thick, typically 0.7 $\mu$m to 2.0 $\mu$m thick, dielectric layer 152 separates the metal 2 layer from the metal 1 layer.

Figure 10:
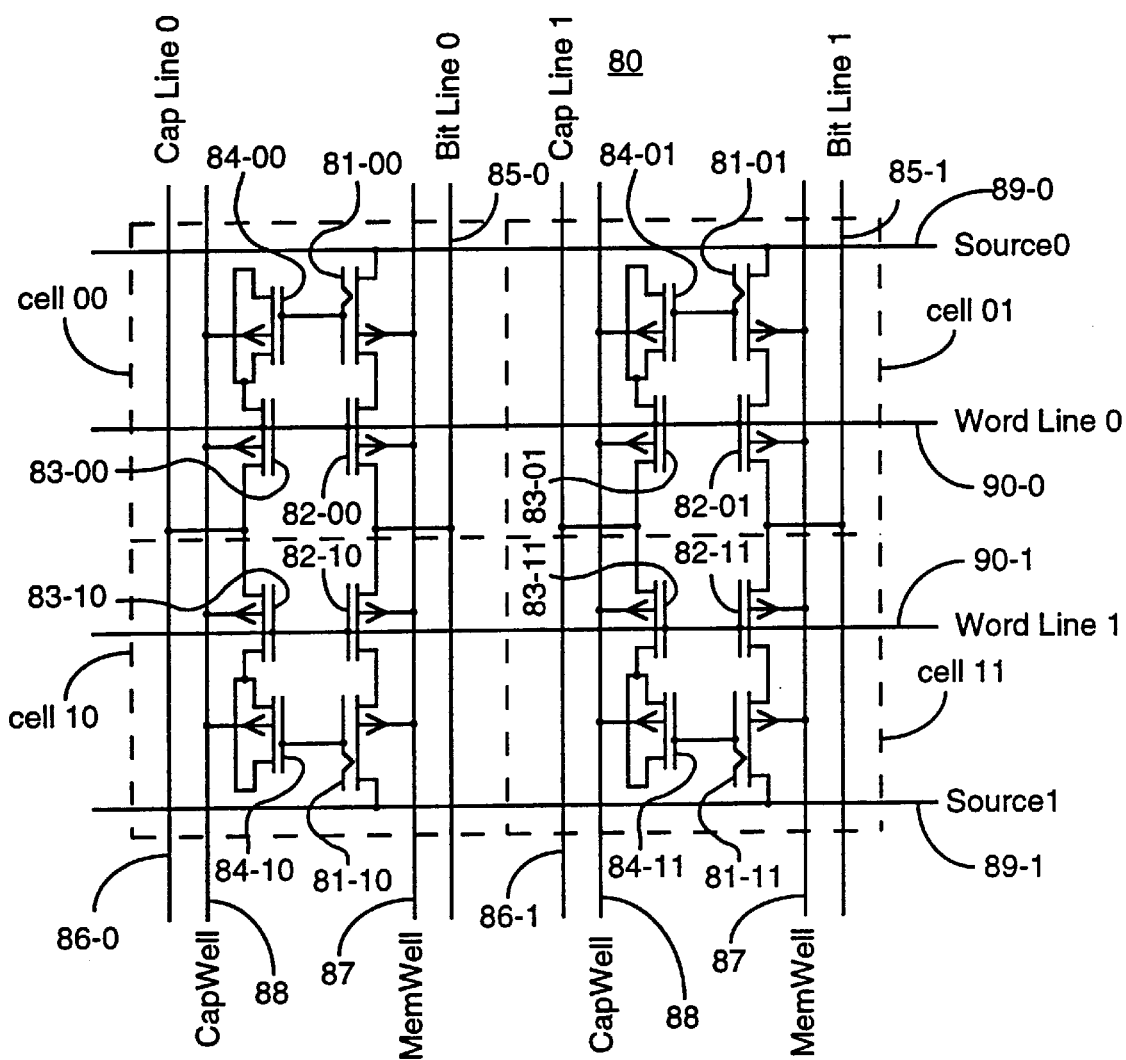
FIG. 10 is a schematic diagram of an array of another embodiment of this invention in accordance with the second method of operation mentioned in the summary.

Another approach to avoiding direct current during writing to the cells is illustrated schematically in FIG. 10. In this cell source select transistors are omitted and in their stead are placed transistors 83-00 through 83-11 having their gates connected to their respective row lines to provide selection of the control line capacitors 84-00 through 84-11. This embodiment operates by erasing all of the bits in a word and then selectively programming memory cells in that word to establish a desired bit pattern, as described in Table 3.

TABLE 3

| | Read | Program | Erase |
| --- | --- | --- | --- |
| Word line | 0 (selected) | 0 (selected) | 0 (selected) |
| | $V_{DD}$ (deselected) | $V_{PP}$ (deselected) | $V_{PP}$ (deselected) |
| Bit line | $V_{DD}$ −1.5 V | 0 | $V_{PP}$ |
| Source Select | 0 | 0 | $V_{PP}$ |
| Source | $V_{DD}$ | float | float |
| Memory N well | $V_{DD}$ | 0 | $V_{PP}$ |
| Capacitor line | $V_{DD}$ | $V_{PP}$ (selected) | 0 |
| | | 0 (deselected) | |
| Capacitor well | $V_{DD}$ | $V_{PP}$ | 0 |

During read mode, all of the N wells are biased at $V_{DD}$, as are the capacitor control lines. The selected row line is biased at ground and the unselected row lines are biased at $V_{DD}$. A moderate voltage (e.g. 2 V) is applied to the selected bit lines to sense the state of the selected cells while the unselected bit lines float, as with the cell shown in FIG. 7. The source lines are biased at $V_{DD}$ in the read mode.

To erase a word, all the memory array N wells for the word selected are biased at $V_{PP}$ and all the capacitor N wells for the word selected are biased at ground. The selected row line is biased at ground and the unselected row lines are biased at $V_{PP}$. (As with the cell shown in FIG. 7, the cells and control capacitors are all precharged to ground at the beginning of an erase cycle.) The source lines are allowed to float, but to erase a word at a time it is necessary to decode the source lines just as the row select lines are decoded in the prior art N channel array discussed previously. The source decoding is not needed if the application doesn't require word writeability.

To selectively program bits within a word, all of the memory wells 87 for the selected word are biased at ground and all of the capacitor wells 88 for the selected word are biased at $V_{PP}$. Word lines 90 and bit lines 85 are all biased at ground while the bias on the capacitor wells 88 is increased to $V_{PP}$. This prevents the well bias from coupling the floating gates on the unselected rows to such a high voltage that significant tunneling occurs on the cells on the unselected words. Once this set of biases is established, the unselected word lines are biased at $V_{PP}$ to isolate the memory transistors and the control capacitors on the unselected word lines. The capacitor control lines of the bits to be programmed are then biased to $V_{PP}$. This couples the selected floating gates to a high voltage and tunneling occurs across the thin oxides to program the selected cells. The disturb discussion that applied to the cell shown schematically in FIG. 7 applies to this cell also.

Figures 11, 11A:
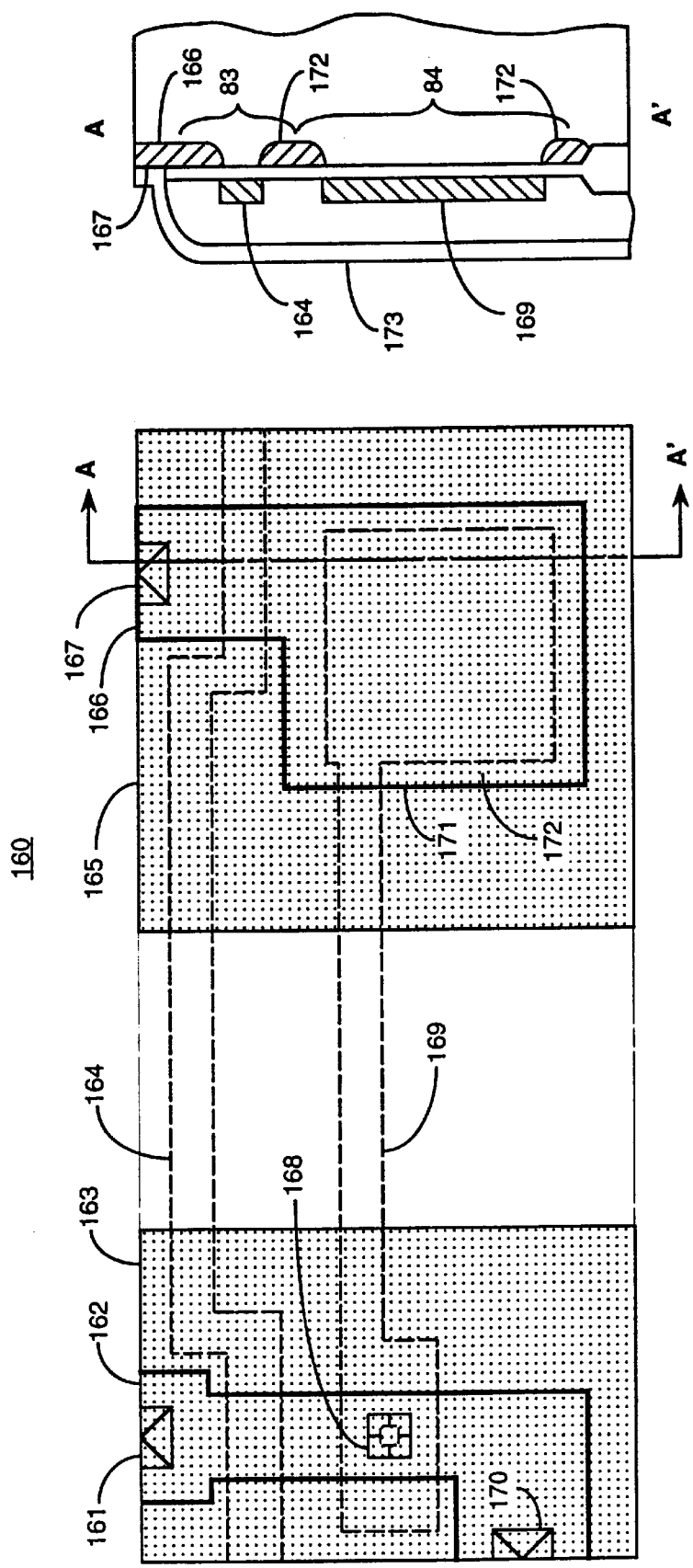
FIG. 11 is a top view and FIG. 11a is a cross section view showing one embodiment of a single one of the memory cells shown schematically in FIG. 10.

FIG. 11 shows one embodiment of a layout that implements this approach to the P channel EEPROM cell. As in the cell layout shown in FIG. 9, row line 164 is a horizontal trace that forms in this case both the select transistor 83 for both the capacitor 84 and the select transistor 82 memory transistor 81. Bit lines 85 and capacitor control lines 86 (FIG. 10) are routed vertically in metal 1. The metal 1 capacitor control line is seen as trace 173 in FIG. 11a. The source lines are routed horizontally in metal 2, not shown. As in FIG. 9, the metal layers and the metal vias are omitted from the top view in the interest of clarity.

Figure 12:
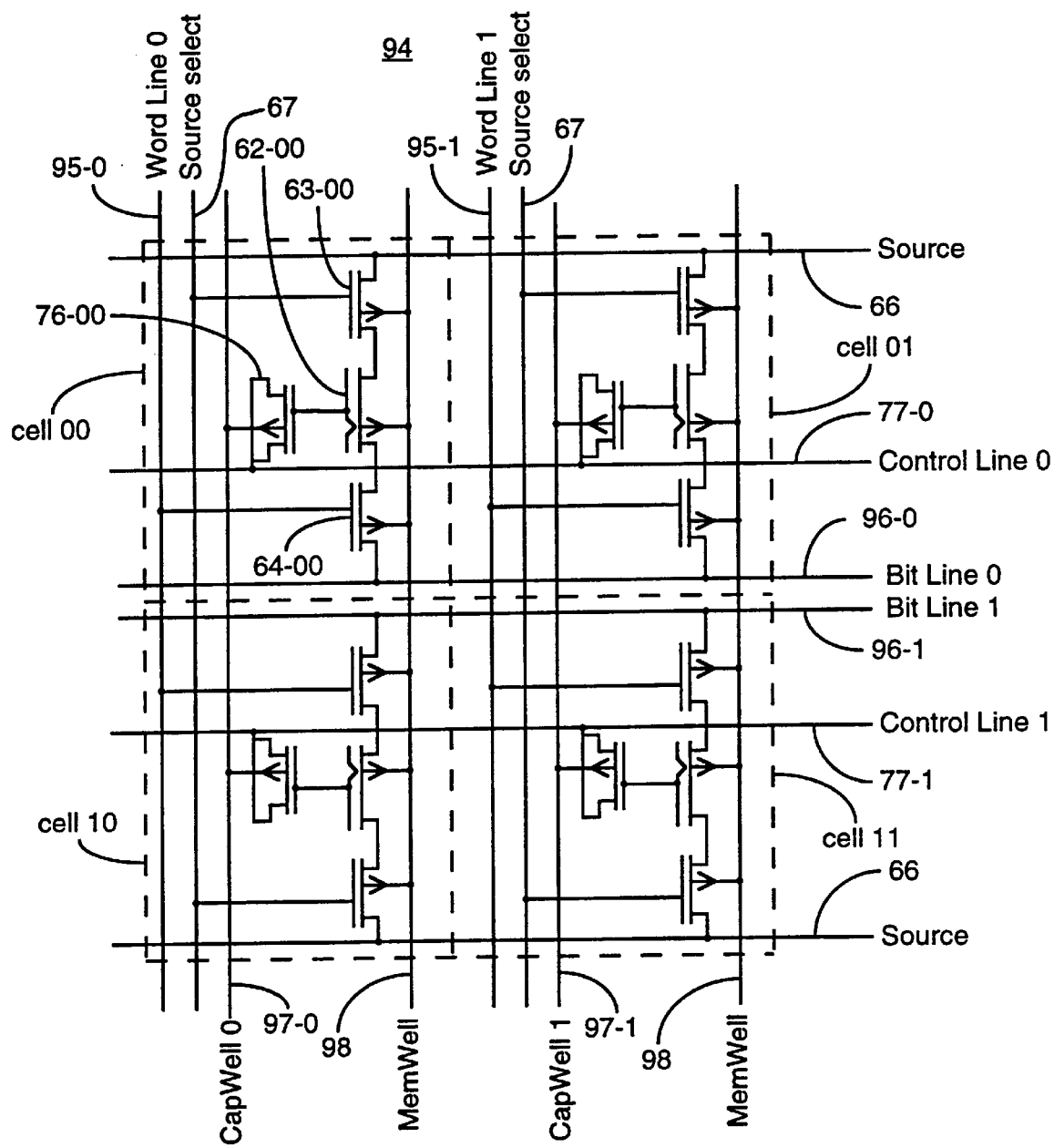
FIG. 12 is a schematic diagram of an alternative embodiment of an array of cells in accordance with the teachings of this invention.

Although calculation shows that the cells shown schematically in FIG. 7 and FIG. 10 can be designed so that the disturbs inherent in the layout are acceptable, it is of interest to design cells that are inherently even less susceptible to disturbs. FIG. 12 shows schematically one such memory cell. Comparison of FIG. 7 and FIG. 12 shows that the embodiment of FIG. 12 differs from the embodiment of FIG. 7 in that the word lines 95-0 and 95-1 run parallel to the well lines and bit lines 96-0 and 96-1 run perpendicular to the well lines. The significance of this is that during programming only one capacitor well line (e.g. well line 97-0) must be biased to $V_{PP}$. The remainder of the well lines (e.g. well line 97-1, i.e. the unselected wells) remain at ground so that the cells capacitively coupled to the unselected capacitor well see no disturb voltage. If the whole row is programmed together or if the wells for individual words are decoded, no cells experience the disturb condition. If only one word in a row with undecoded capacitor N well is to be programmed, the other cells in the row will experience the disturb condition, but cells will be disturbed many fewer times than in the case that programming any cell produces disturb conditions. The operation is described in Table 4.

TABLE 4

|  | Read | Program | Erase |
| --- | --- | --- | --- |
| Word line | 0 (selected) | 0 (selected) | 0 (selected) |
|  | $V_{DD}$ (deselected) | $V_{PP}$ (deselected) | $V_{PP}$ (deselected) |
| Bit line | $V_{DD}$ −1.5 V | 0 | $V_{PP}$ (selected) |
|  |  |  | 0 (deselected) |
| Source | $V_{DD}$ | float | float |
| Memory N well | $V_{DD}$ | 0 (selected) | $V_{PP}$ |
|  |  | 0 to 3 volts (deselected) |  |
| Control line | $V_{DD}$ | $V_{PP}$ (selected) | 0 |
|  |  | 0 (deselected) |  |
| Capacitor well | $V_{DD}$ | $V_{PP}$ (selected) | 0 |
|  |  | 0 (deselected) |  |

Figure 13:
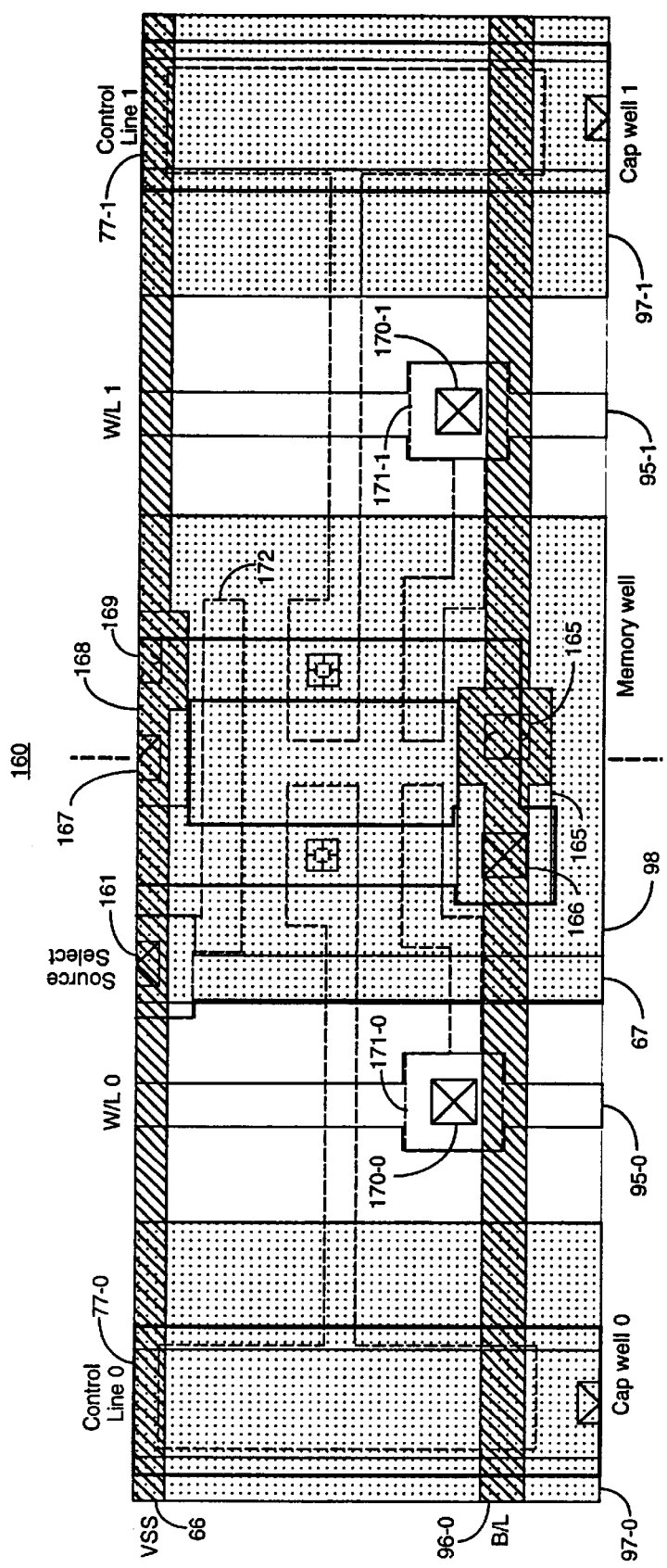
FIG. 13 is a top view showing the layout of one embodiment of a block of two cells illustrating the schematic diagram of FIG. 12.

One embodiment of layout of two cells that implements the embodiment of FIG. 12 is shown in FIG. 13. The two cells lie to the left and right of the bold dashed vertical line appearing in FIG. 13. In this layout capacitor N wells 97-0 and 97-1 are shared between two adjacent memory rows in order to reduce cell area although this is not required. The disturb condition on the adjacent row can be minimized by biasing the memory well for this row to a small positive voltage (e.g. 2 V to 3 V). This will reduce the disturb condition by an equivalent amount. The operation of this cell is the same as that of the cell shown in FIG. 7 except for the decoding of the capacitor N wells. In the cell embodiment in FIG. 13, if the memory cells on word line 95-0 are to be programmed, capacitor well line 97-0 is biased at $V_{PP}$, but capacitor well line 97-1 and all other capacitor wells remain biased at ground, which removes the possibility of disturbing cells selected by word line 95-1 and all other such word lines.

The cost of the minimization of the disturb conditions is that the cell area is increased because there must now be space in the vertical direction for two contacts in separate diffusions where in FIG. 9 the contact was shared. This is seen in FIG. 13 where contact 166 provides a connection from bit line 96-0 to the memory transistors selected by the two word select transistors whose gates are formed by the polysilicon traces 171-0 and 171-1. The connection from the bit line running in metal 2 to the diffusion is mediated through the metal 1 island 165 and the metal 1 to metal 2 via 165. The active area in which contact 166 is located must be spaced apart from that in the cells that would be formed from a vertical mirror image of the cells shown. This increase in layout area caused by this additional spacing that is required in the embodiment of FIG. 13 and not in the embodiment of FIG. 9 is about 20% per cell. The operation of this embodiment is shown in Table 5.

Figure 14:
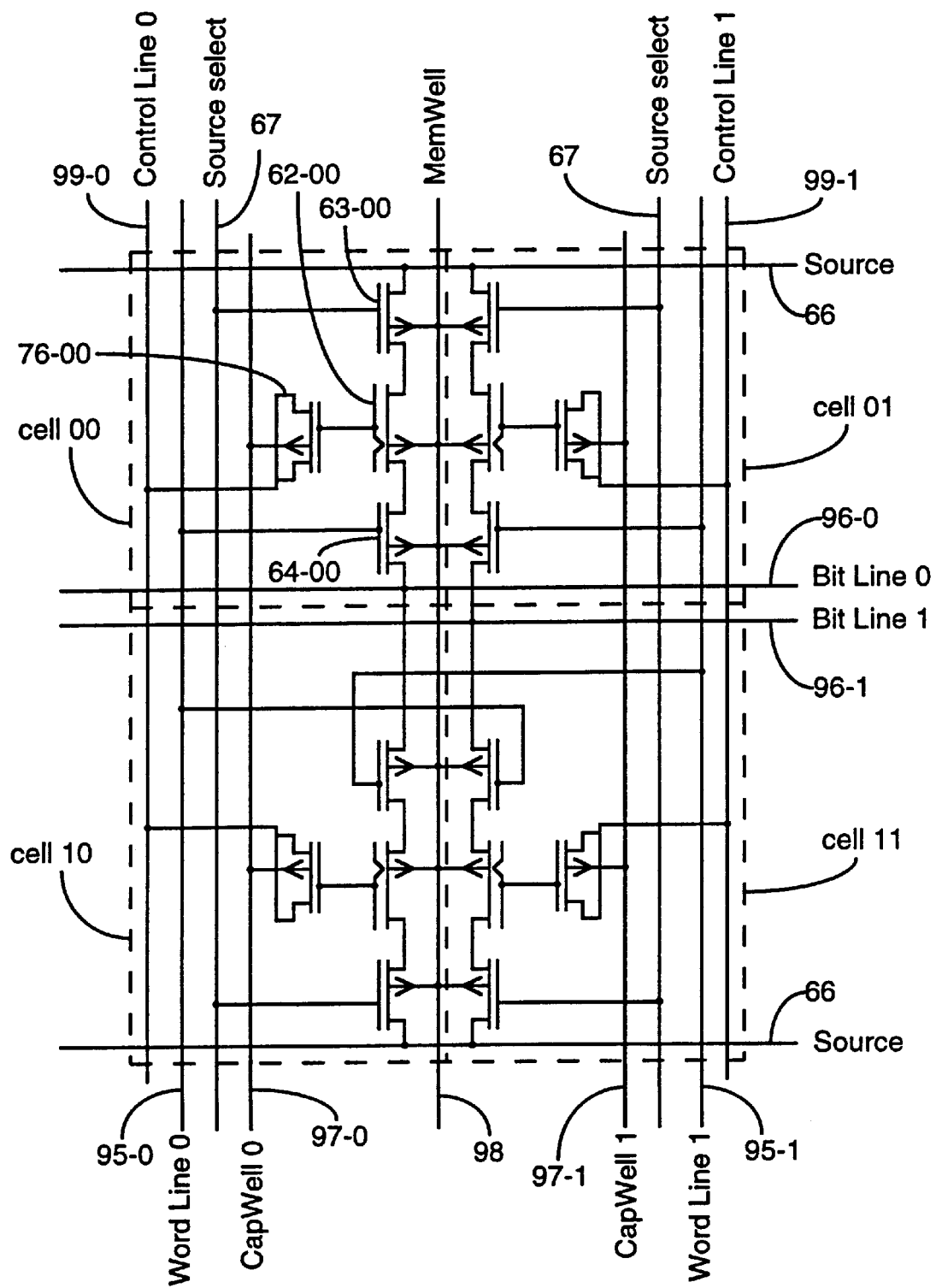
FIG. 14 is a schematic diagram of another embodiment of an array of cells in accordance with the teachings of this invention.

FIG. 14 shows schematically one embodiment of an array of cells that achieves the minimization of the disturb that was achieved in the embodiment of FIG. 12 yet occupies essentially the same area as the embodiment of in FIG. 7. This is made possible by using crisscrossed word lines 95. During the read mode and the erase mode the capacitor control lines are all at the same potential, so the consequences of the crisscross are immaterial. All that matters is that the cells selected are unique.

TABLE 5

|  | Read | Program | Erase |
| --- | --- | --- | --- |
| Word line | 0 (selected) | 0 (2 adjacent) | 0 (selected) |
|  | $V_{DD}$ (deselected) |  | $V_{PP}$ (deselected) |
| Bit line | $V_{DD}$ −1.5 V | 0 | $V_{PP}$ (selected) |
|  |  |  | 0 (deselected) |
| Source select | 0 | 0 | $V_{PP}$ |
| Source | $V_{DD}$ | float | float |
| Memory N well | $V_{DD}$ | 0 | $V_{PP}$ |
| Control line | $V_{DD}$ | $V_{PP}$ (2 adjacent selected) | 0 |
|  |  | 0 (deselected) |  |
| Capacitor well | $V_{DD}$ | $V_{PP}$ (2 adjacent selected) | 0 |
|  |  | 0 (deselected) |  |

During the programming mode, the crisscross of the word lines across the memory transistor well effects the programming. There are two methods is which this array can be operated. In one method, two adjacent words in the same memory well are programmed at the same time by applying $V_{PP}$ to the two adjacent capacitor wells and control nodes. In this method, the word lines are operated as two independent interlaced word lines in the read and erase modes. In a second method, only the adjacent cells in the common memory well are treated as one word that must be accessed in an upper half/lower half mode during erasing and reading. The operation of this embodiment is shown in Table 6.

TABLE 6

|  | Read | Program | Erase |
| --- | --- | --- | --- |
| Word line | 0 (selected) | 0 | 0 (selected) |
|  | $V_{DD}$ (deselected) |  | $V_{PP}$ (deselected) |
| Bit line | $V_{DD}$ −1.5 V | 0 | $V_{PP}$ (deselected) |
|  |  |  | 0 (selected) |
| Source select | 0 | 0 | $V_{PP}$ |
| Source | $V_{DD}$ | float | float |
| Memory N well | $V_{DD}$ | 0 | $V_{PP}$ |

TABLE 6-continued

| | Read | Program | Erase |
|---|---|---|---|
| Control line | $V_{DD}$ | $V_{PP}$ (selected) 0 (deselected) | 0 |
| Capacitor well | $V_{DD}$ | $V_{PP}$ | 0 |

What this means is that the two adjacent capacitor rows are biased to $V_{PP}$ to program all of the adjacent cells in the memory well e.g. lines 99-0, 95-0, 99-1, and 95-0 are all biased to $V_{PP}$ simultaneously. During erasing and reading, first one word line 95-0 selects one half of the word and connects it to the bit lines 96 and then in a sequential operation, the other word line 95-1 connects the other half of the word to the bit lines 96. This form of operation is actually commonly used in devices with multiplexed data buses (e.g. the 8088 microprocessor).

Figure 15:
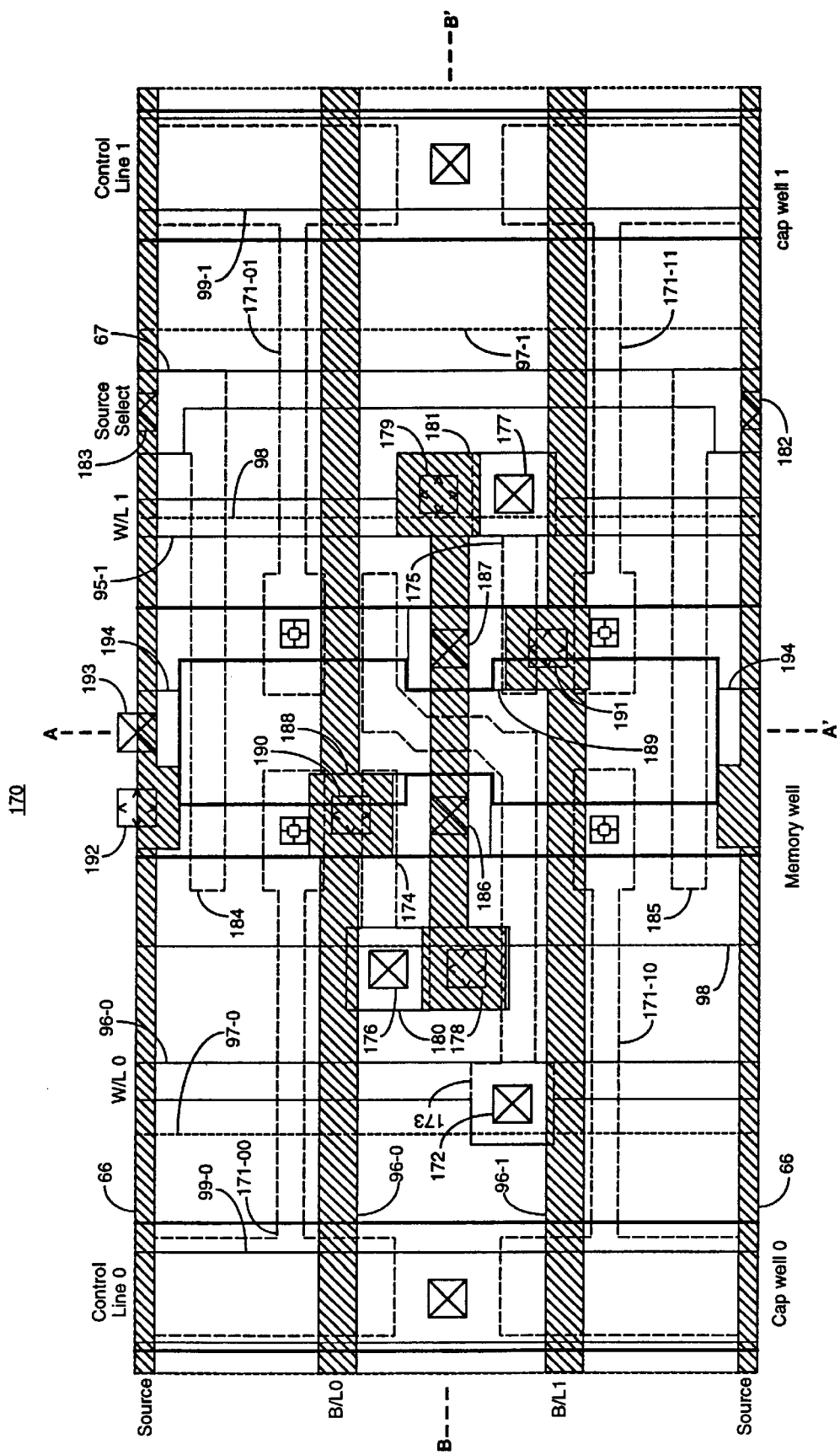
FIG. 15 is a top view showing the layout of one embodiment of a block of four cells illustrating the schematic diagram of FIG. 14.

FIG. 15 shows the top view of a block of one embodiment of four cells laid out in conformance to the embodiment of in FIG. 14. The four quadrants formed by lines extended between the bold dashed line pairs A-A' and B-B' correspond to the four cells shown in FIG. 14. Thus the polysilicon traces 171-00 forms the gates of the memory transistor 62-00 and the MOS capacitor 76-00. One of the crisscrossed select gates in FIG. 15 is fairly easy to see. The polysilicon trace 173 which is connect to word line 96-0 by the contact 172 forms the select gate for the cells labeled 01 and 10 in FIG. 14. The word select gates for other two cells 00 and 11 are formed by the polysilicon traces 174 and 175, respectively. The gate electrode for cell 11 is connected to the word line 95-1 directly through the contact 177. The connection for the select gate for the cell 00 is less direct. The metal 1 line 95-1 is connected by via 179 to the metal two trace 181 through the via 179. Via 178 connects metal 2 trace 181 to metal two trace 181 through the via 179. Via 178 connects metal 2 trace 181 to metal 1 trace 180 which ultimately connects to the polysilicon trace 174 through contact 176. The metal 2 traces are shown as cross hatched areas in FIG. 15.

The source lines 66 run through the array horizontally in metal 2 and connect to the active regions of the cells through the mediation of via 192, metal 1 trace 194 and contact 193. These three elements are shared between adjacent cells. Thus the contact and via extend beyond the source line at the top by the amount that they extend into the cell at the bottom. Bit lines 96-0 and 96-1 also run horizontally through the array in metal 2. Bit line contacts 186 and 187 to the active areas area buried under metal 2 trace 181 and accessed by means of metal 1 regions 188 and 189 and vias 190 and 191. N well regions 97-0, 97-1 and 98 are indicated by the lines with short dashes.

Control lines 99-0 and 99-1 are routed through the array in metal 1 traces as is source select line 67. The contacts for the control lines lie between the control capacitors that share the same well. The source select line connects to two poly silicon traces 184 and 185 that form the gates of the source select transistors at half contacts 182 and 183. Polysilicon traces 184 and 185 are each one half of a piece of polysilicon that forms the select transistor gates for four adjacent cells.

Embodiments without a Tunnel Window

Figure 1A:
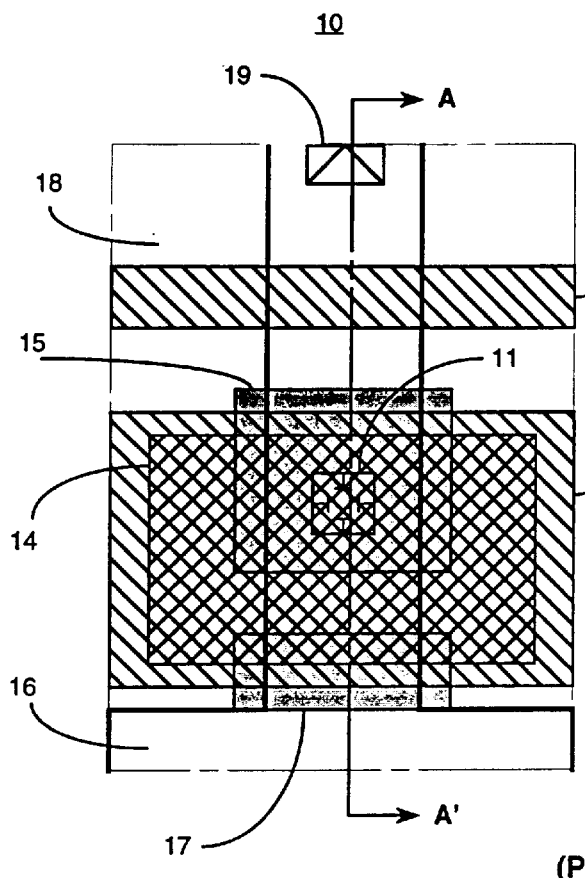
FIG. 1a is a top view of and FIG. 1b is a cross section through a typical prior art EEPROM cell.
Figure 1B:
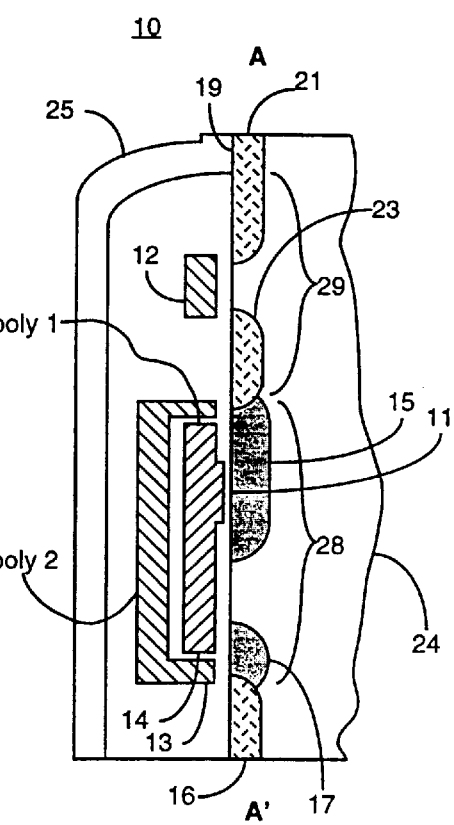
Figure 2A:
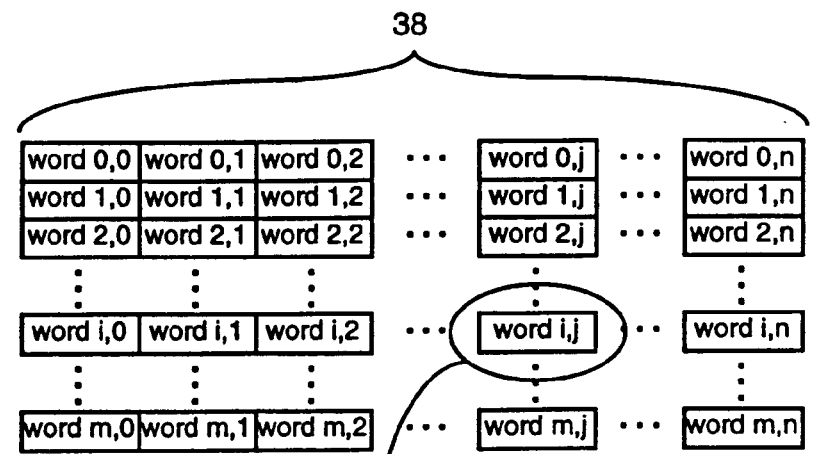
FIG. 2a is a block diagram of a typical prior art EEPROM array.
Figure 2B:
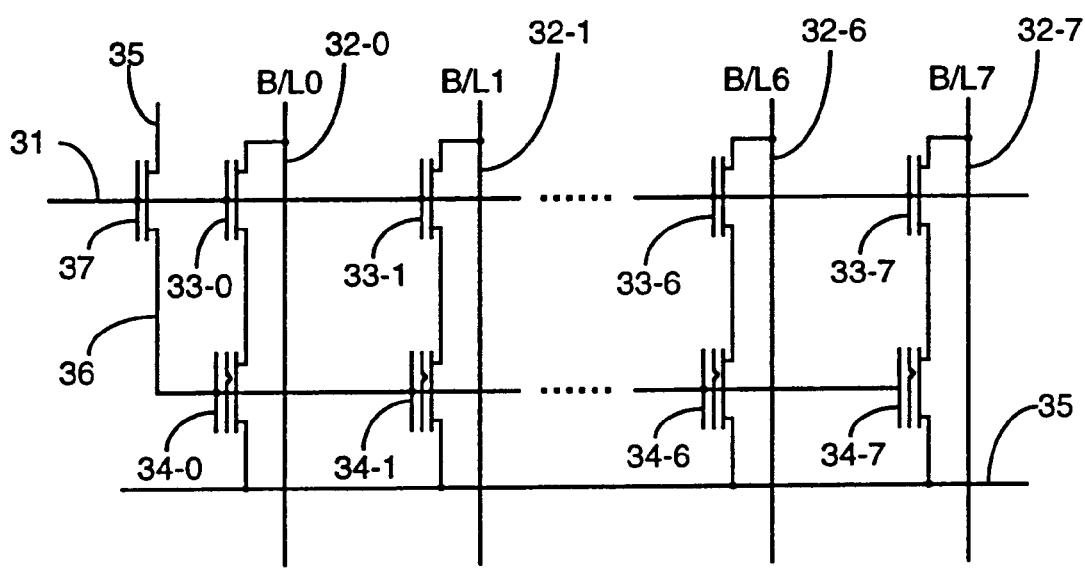
FIG. 2b is a schematic diagram of a group of prior art EEPROM cells integrated into an array for storing a word of data.

In the case of N channel EEPROMS, it is the usual practice to place a thin tunnel window surrounded by thicker oxide over the N diffusion that lies under the drain side of the floating gate to provide a path through which tunneling is to occur, as is illustrated in FIG. 1.

A major reason for the window is to suppress band-to-band tunneling. Band-to-band tunneling, sometimes referred to as Zener tunneling, is a phenomenon in which electrons tunnel from an occupied valence band state in the silicon to a vacant conduction band state in the silicon. This tunneling is the result of a high local electric field in the silicon. If a high voltage is applied to a drain that extends under a grounded gate separated from the substrate by a thin oxide layer, a high local field will occur near where the junction reaches the oxide surface. The current that results from the band-to-band tunneling has at least two detrimental effects. One is that the current provides a load on the on-chip charge pump. A second is that the tunneling generates an equal number of electrons and holes. The holes can acquire kinetic energy directed toward the gate oxide and, consequently, become injected into the oxide. Holes injected into oxide have a high probability of creating defects and becoming trapped which leads to degradation of the oxide.

It is desirable that the tunnel window be as small as the smallest feature allowed in the technology. This is both because the extension of the N diffusion under the floating gate must be at least the size of the tunnel window plus two misregistration tolerances and because the tunnel oxide area is a major contributor to the capacitive load on the coupling because the tunnel oxide has the highest capacitance per unit area of the oxides involved in the cell.

As the lateral dimensions of the integrated circuit are scaled down, it becomes more and more difficult to form the tunnel window. For a 1 $\mu$m scale technology, the oxide window is 1 $\mu$m in diameter and is defined in 1 $\mu$m thick photoresist that is used for a mask. Experience shows that it is possible in a production environment to obtain adequate wetting of the dilute hydrofluoric acid (HF) that is typically used to etch a hole through the thicker surrounding oxide so that the thin tunnel oxide can be grown.

However, at 0.5 $\mu$m scale, the tunnel window is desirably 0.5 $\mu$m in diameter, but the thickness of the photoresist remains at about 1 $\mu$m in order to have the capability to block ion implants and to provide pin hole free coverage, even over steps after a portion has been eroded in a plasma etch. The result is the resist hole through which the etching should take place has an aspect ratio of 2. Experience shows that it is difficult to reliably achieve good wetting with aqueous HF solutions in this case. Metal contacts also face similar aspect ratios and are etched with plasma etchers. Plasma etching the tunnel window oxide incurs the risk of damaging or contaminating the underlying silicon surface upon which the tunnel oxide must be grown.

Since the novel embodiments of a P channel EEPROM, as described above with respect to FIGS. 4–7 and 9–15, provide for erasure by electron tunneling from the floating gate to an inversion layer that extends uniformly under the floating gate, band-to-band tunneling is not an issue. This allows the elimination of the tunneling window, as is now described with respect to several exemplary embodiments.

Figure 16:
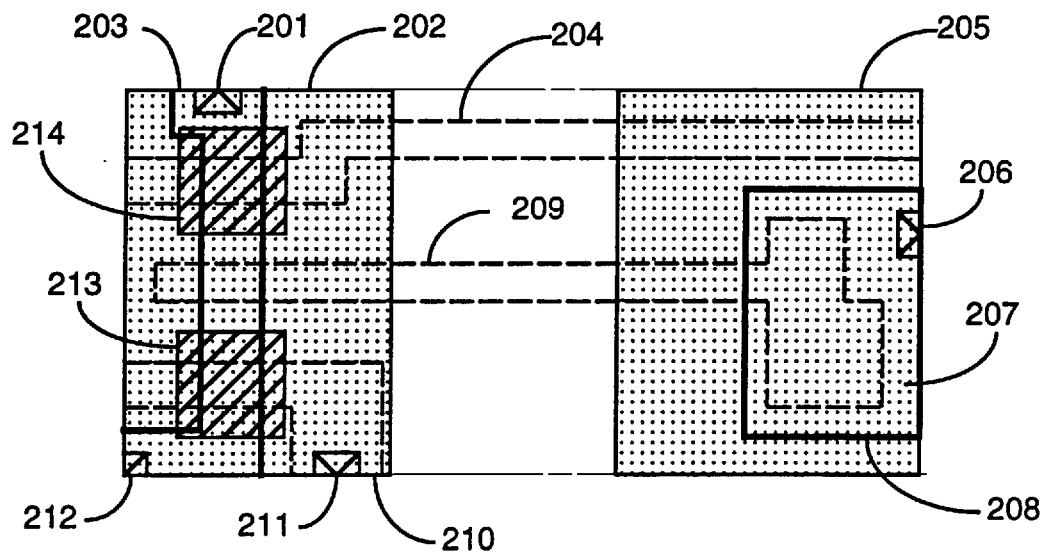
FIG. 16 is a top view of one embodiment of this invention which does not utilize tunneling windows under the floating gate.

FIG. 16 is a layout of a cell 200 in accordance with the teachings of this invention which avoids the use of small tunneling windows. Comparison with the embodiment of FIG. 9 shows that it is a smaller scale version of the same cell. Comparing FIGS. 16 and 9, contact 201, 211 and 212 correspond to contacts 131, 136, and 138, respectively. Similarly N wells 202 and 205 correspond to N wells 139 and 140 and polysilicon traces 204, 209, and 210 correspond to traces 143, 133, and 137, respectively. The essential differences are the absence of tunnel window 135 from cell 200 and the addition of the thick oxide areas 213 and 214 to 200.

The operation of the cells of FIGS. 9 and 16 is the same. The advantages of cell 200 are that the floating gate transistor channel length is relatively shorter and that it is not necessary to etch small tunnel windows. The benefit of the shorter channel length of the floating gate are two-fold. One benefit is that the gate occupies less area. The other is that the read current is increased both because of the shorter channel length and by the thinner gate oxide.

The process for the fabrication of the cells of FIGS. 9 and 16 are also similar. The difference occurs after the gate oxide is partially grown. In the process for fabricating cell 130 of FIG. 9, the wafer is covered with photoresist that is exposed and developed so that only the tunnel window 135 is not covered by the resist. Etching in an aqueous solution of hydrofluoric acid removes the oxide in the region 135. After removal of the photoresist, a thin oxide is grown in the region 135 while the oxide is thickened over the other areas.

In the process for fabricating cell 200, the wafer is coated with photoresist and exposed and developed so that the areas 214 and 213 are covered and the balance of the memory array area is exposed. (The area in which the peripheral transistors are to be formed may be covered or not depending upon the desired thickness of the gate oxide, as will be clear to those with ordinary skill in the art.) Etching in an aqueous solution of hydrofluoric acid removes the oxide in the region not covered by photoresist. After removal of the photoresist, a thin oxide in grown in the regions where the gate oxide was etched while the oxide is thickened over the other areas.

Figure 17:
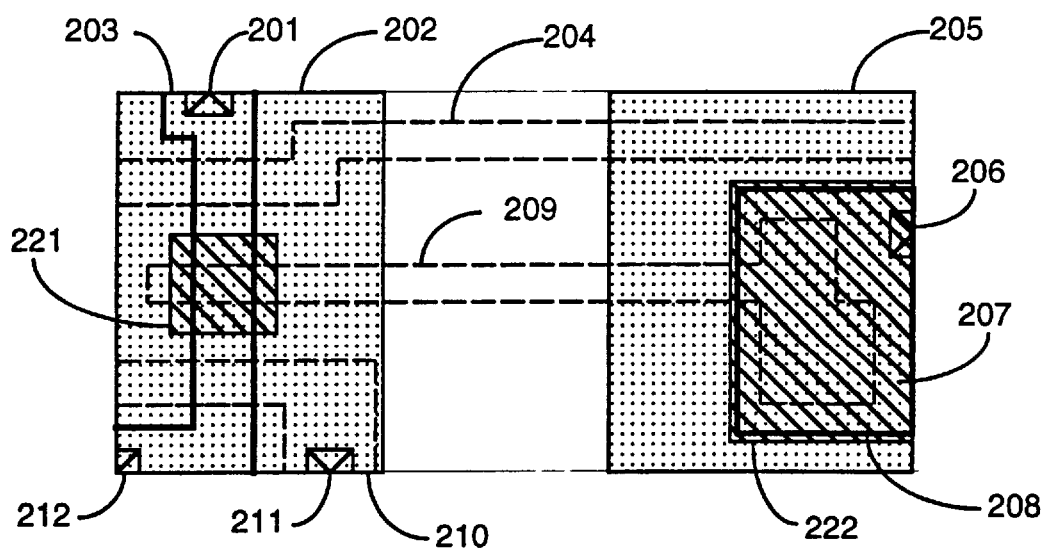
FIG. 17 is a top view showing an alternative embodiment of this invention in which thin oxide areas are larger than areas where polycrystalline silicon overlaps active regions.

Another embodiment of this invention is shown in FIG. 17. In this embodiment the areas of thin oxide are defined and are etched as one would etch a tunnel window. Note, however, that the areas that are etched and regrown as thin oxide regions 221 and 222 are larger than the areas where the polycrystalline silicon overlaps the active regions. If the gate length in the cell 220 is 0.5 $\mu$m, the smallest dimension of the thin oxide regions is about 1.3 $\mu$m which is large enough to be etched by wet etching techniques.

Embodments Without a Source Select Transistor

As described above, with a P channel approach, it is possible to eliminate the tunnel window and consequently reduce the channel length of the memory transistor the minimum allowed by the technology. It was also noted above that it is not possible to connect the columns on a row to a common source in p-channel technology because of current flow from a cell being erased to a cell that is not be erased in the same row. For this reason a source select gate is used in various embodiments discussed above.

In this embodiment, individual source select transistors in each cell are not required. A separate source line is run through the array for each column so that a shared source select transistor is used to provide the necessary isolation for all of the memory transistors on a column. By sharing the source select transistor over all of the cells in a column a substantial decrease in array area is achieved. In another embodiment, the control gate and the row select gate are merged together into a transistor with a common gate. This embodiment uses a double layer polysilicon process and allows the cell to be laid out in a small area.

Figure 18:
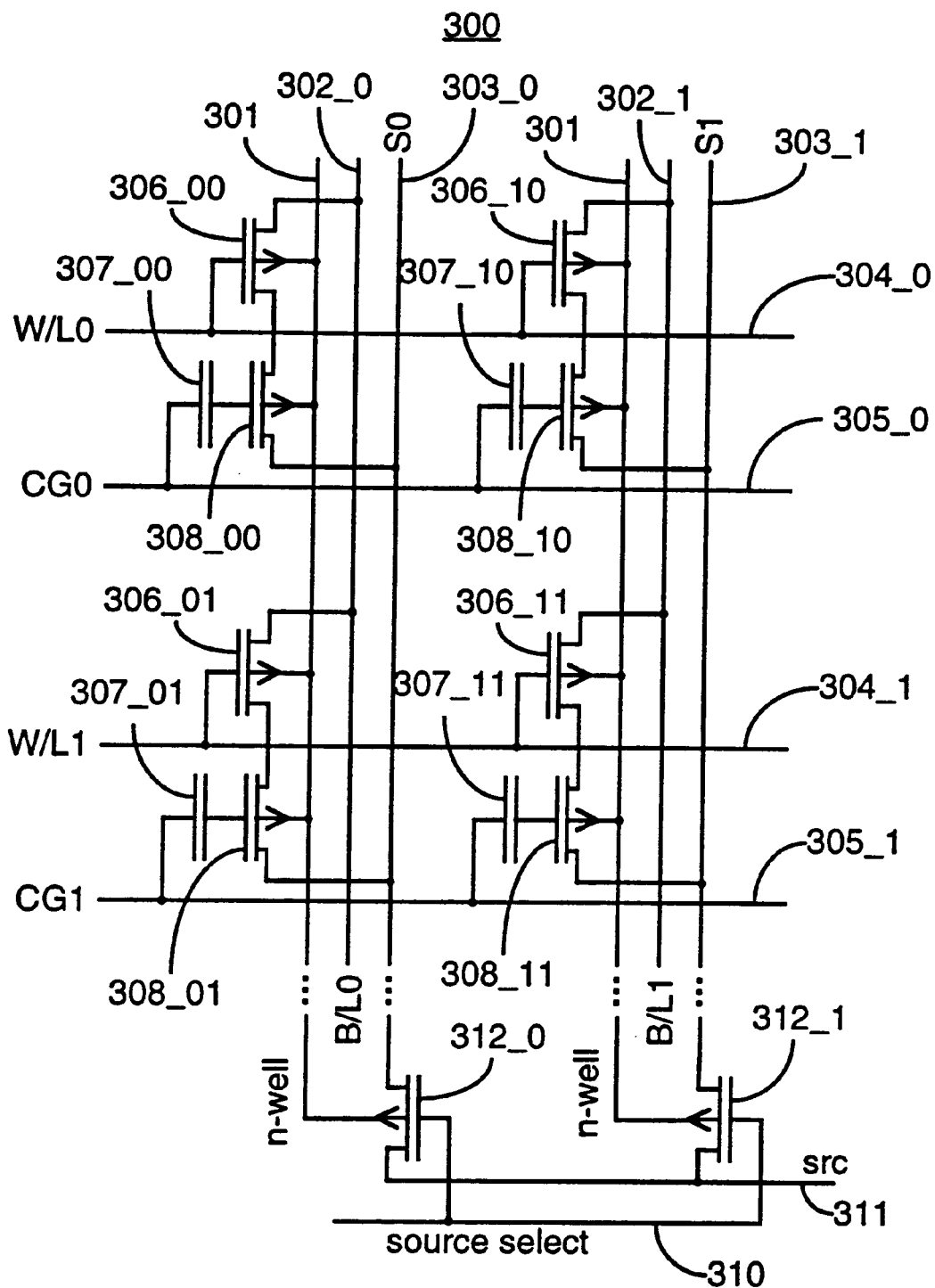
FIG. 18 shows schematically the cell arrangement in accordance with an alternative embodiment of the invention.

FIG. 18 shows schematically one embodiment of this invention. Transistors 308-00 though 308-11 are the memory transistors of the four cells depicted; transistors 306-00 through 306-11 are the word line transistors that connect selected cells to their bit lines. Capacitors 307-00 through 307-11 couple the voltage applied to control gate lines 305-0 and 305-1 to the floating gate memory transistors. The connection of array source lines 303-0 and 303-1 to common source line 311 is determined by the state of source switches 312-0 and 312-1. These transistors may be either turned on or off depending on the state of the common source select line.

The voltages applied for the operation of the array are shown in Table 7. In all the modes it is assumed that row 0 is being accessed. In the read mode, the source select connects the column source lines to the common source line. A voltage of about $V_{DD}$-1.5 V is applied to the bit lines that are to be read. If the floating gate of an accessed cell has been erased so that its potential is more positive than ($V_{DD}$-$V_{tP}$), the cell will not conduct. If the cell potential is less positive than that value, the cell will conduct.

TABLE 7

| Signal | Read Mode | Program Mode | Erase Mode |
|---|---|---|---|
| B/L0 | $V_{DD}$-1.5V | 0 V | 0 V |
| B/L1 | $V_{DD}$-1.5V | 0 V | $V_{PP}$ |
| W/L0 | 0 V | 0 V | 0 V |
| W/L1 | $V_{DD}$ | 0 V | $V_{PP}$ |
| CG0 | $V_{DD}$ | $V_{PP}$ | 0 V |
| CG1 | $V_{DD}$ | 0 V | $V_{PP}$ |
| S0 | $V_{DD}$ | float | float |
| S1 | $V_{DD}$ | float | float |
| Source Select | 0 V | $\geq$ 0 V | $V_{PP}$ |
| Source | $V_{DD}$ | 0 V | $\leq V_{PP}$ |
| memory N well | $V_{DD}$ | 0 V | $V_{PP}$ |
| capacitor well | $V_{DD}$ | $V_{PP}$ | $V_{PP}$ |

In order to program a block of cells, the control line to those cells is biased at VPP with the well at 0 V. This accumulates the well beneath the floating gate and causes electrons to tunnel from the accumulation layer to the floating gates. The voltages applied to the array junctions are merely to assure that current is not injected into the well.

The biases and operation for read and erase modes are the same as those applied in the earlier disclosure. For the erase mode, the selected word line is biased at 0 V to turn on the line select transistors for this row and the unselected cells are isolated from the bit lines by transistors whose gates are biased at $V_{PP}$. The control lines are biased at the same potentials as the word lines for their cells (i.e. $V_{PP}$ for the unselected and 0 V for the selected). The N well is biased at $V_{PP}$ and the bit lines for those cells that are to be erased are biased at $V_{PP}$; the bit lines for those cells that are not to be erased are biased at 0 V. For the selected row, those cells that have $V_{PP}$ applied to the bit line will have an inversion layer formed under the floating gate with a potential of $V_{PP}$. Electrons will tunnel from the floating gate to the inversion layer. Those selected cells that have 0 V on the bit line will experience low electric field across the gate oxide because the control line is also at 0 V. The bit line select transistors will isolate the cells on the unselected rows from the bit line potential. The selected cells that have $V_{PP}$ applied to the bit line will tend to pass $V_{PP}$-$V_{fg}$ through to their column source lines. Since the unselected cells have the control lines at $V_{PP}$, this will result in a small potential across the gate oxide of the unselected rows on the columns being erased. The selected cells that are not being erased will tend to pass 0 V through to their sources. Therefore, the cells on the unselected rows will have their source at 0 V with their gates at approximately $V_{PP}$. This will cause a depletion region to form in the channel region. Much of the potential difference between the N well and the floating gate will occur across the depletion region so that the voltage across the gate oxide is low enough that no significant tunneling occurs. The potential problem is in the region of overlap of the gate over the source diffusion. Calculation of the electric fields with a two dimensional device simulator shows that the profile of lightly doped source diffusions can be designed so that the underlap diffusion is lightly doped enough that the underlap region is also depleted with the result that there is no significant tunneling current in the overlap region. In fact, junction leakage caused by band-to-band tunneling arising in the region near the intersection of the source junction with the gate oxide will limit the junction potential for realistic charge pumps before tunneling can take place. Therefore, designing junction profiles that are graded to reduce the band-to-band tunneling current to acceptable levels guarantee that the oxide tunneling levels are at acceptably low levels.

The embodiment of FIG. 18 is in concept similar to the previously described embodiment of FIG. 5, with the exception that the source select transistor has been combined for a whole column with a resultant savings of silicon area. Although the shared column source switch is shown as a P channel transistor in the embodiment of FIG. 18, it is clear to one with ordinary skill in the art that this could be replaced with an N channel transistor with slight changes in the read bias conditions.

Figure 19:
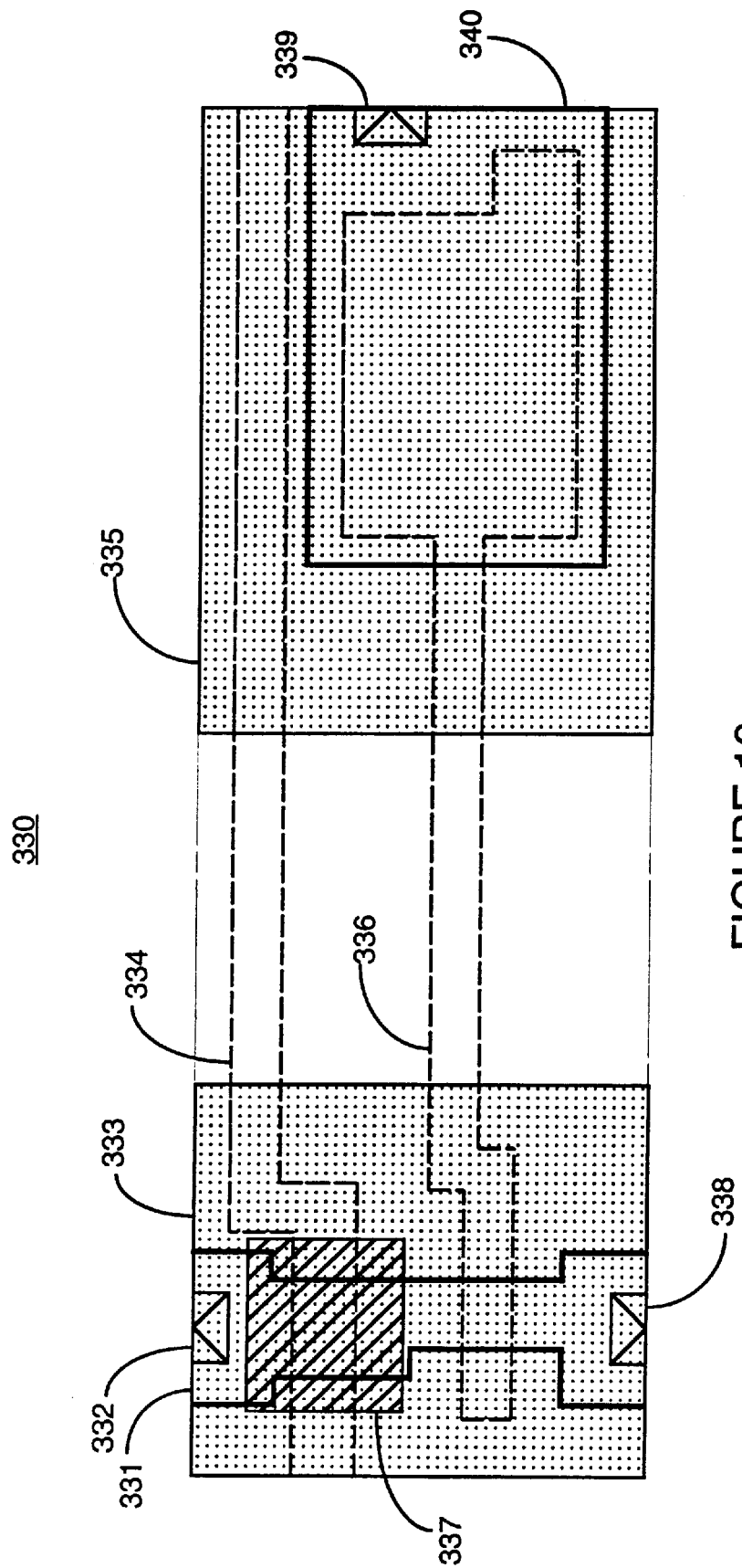
FIG. 19 shows the layout of an EEPROM cell in accordance with this invention implemented in a single poly, two level metal process utilizing an N well capacitor.

An example of the layout of a cell 330 that follows the schematic of FIG. 18 is shown in FIG. 19. The layout shown in this figure can be compared with the previously described embodiment of FIG. 9. These two layouts were done utilizing the same topological design rules and have the same floating gate coupling ratio. The omission of the source select gate from the individual cell of FIG. 19 reduces the individual cell area to 85% of that of the layout shown in FIG. 9. The source select gate is still required in the guise of the column source switch, but in a typical 32×32 array (a 1024 bit memory) the switch is shared over 32 rows and so only about 3% of the area of the switch is allocated to each cell. In this layout the row select transistor is formed by the overlap of the polysilicon word line trace 334 over the active region 331. The floating gate transistor is formed by the overlap of the polysilicon trace 336 over the active region 331. The capacitor for coupling voltage from the control line to the floating gate is formed by the overlap of the polysilicon trace 336 over the active region 340. The active region 331 and 340 is formed in an N well. The active region 340 is formed in a P region that has received a depletion implant in the area 335 after the field oxide is grown and prior to the poly deposition. Such ion implants are commonly available in mixed signal processes. The row select transistor is formed over a region of thicker gate oxide 337 as is discussed above. Contact 339 allows the control line, which runs through the cell in the long direction in metal 2, to be connected to the P+ diffusion that surrounds the coupling capacitor plate through the intermediation of metal 1 and a metal 1 to metal 2 via. The bit line and column source line pass through the cell in metal one and connect to the active region 332 at the contacts 332 and 338, respectively. A metal 2 bridge is used in combination with metal 1 to metal 2 vias to allow the column source line to pass over the bit line to contact to the active region 338.

Figure 20:
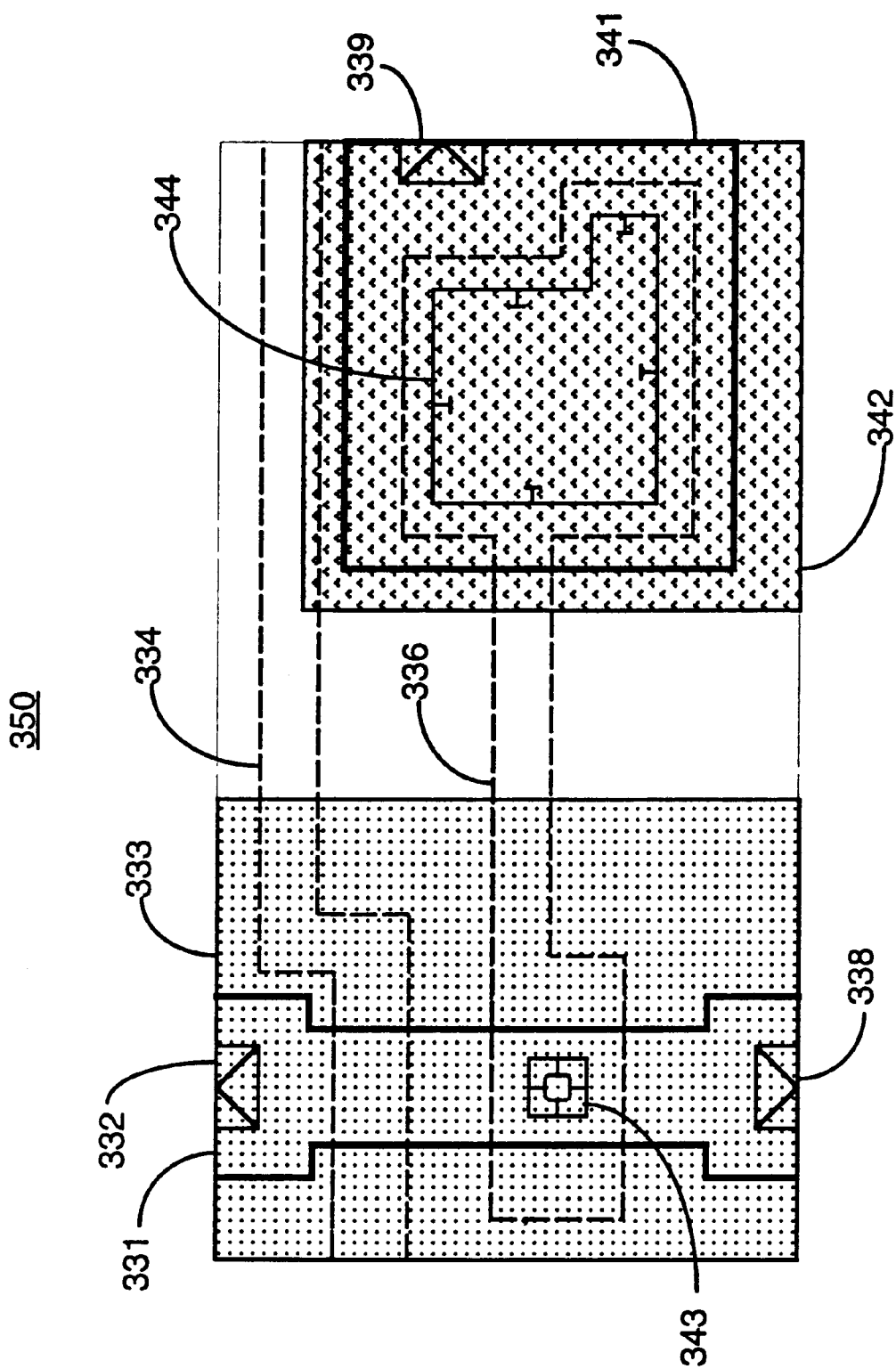
FIG. 20 shows the layout of an EEPROM cell in accordance with this invention implemented in a single poly, two level metal process utilizing an N type depletion capacitor.

It is, of course, not necessary to practice this invention all in an embodiment that doesn't use a tunnel window under the floating gate. FIG. 20 shows a cell layout that follows the schematic shown in FIG. 18, but uses a tunnel window 343 under the floating gate. The identification numbers of the features in FIG. 20 that correspond to those in FIG. 19 are the same for easy comparison. It can be seen that the structural changes within the memory N well 333 consist of replacing the thick gate oxide region 337 under the row select transistor with the tunnel oxide window 343 under the floating gate transistor. The thickness of the oxides under the row select transistor could be the same in the two cases; the difference is merely one of how the different oxide thicknesses are defined.

The implementation shown in FIG. 20 has the advantages that during erase the thicker gate oxide at the source edges suppresses band-to-band tunneling on the unselected transistor and that, since the tunnel regions are spaced away from the source junction, any possible tunneling from the floating gate to the source junction is eliminated.

Inspection of Table 7 shows that the control lines and word lines for a given row are in the same bias states during erasure, allowing the word line and control lines to be merged. In a two level poly technology, this is attractive because it allows reduction of the cell area. One embodiment of this invention using merged word and control lines is shown FIG. 21. The transistor-like symbol 321 is intended to indicate a transistor with two layers of polysilicon with the top layer overlapping the first layer deposited so as to form transistors in a series with the floating gate transistor that is formed by the first level polysilicon. The formation of the transistor on the source side is not necessary for the practice of this invention, but is preferred to make the coupling capacitance alignment insensitive.

Figure 21:
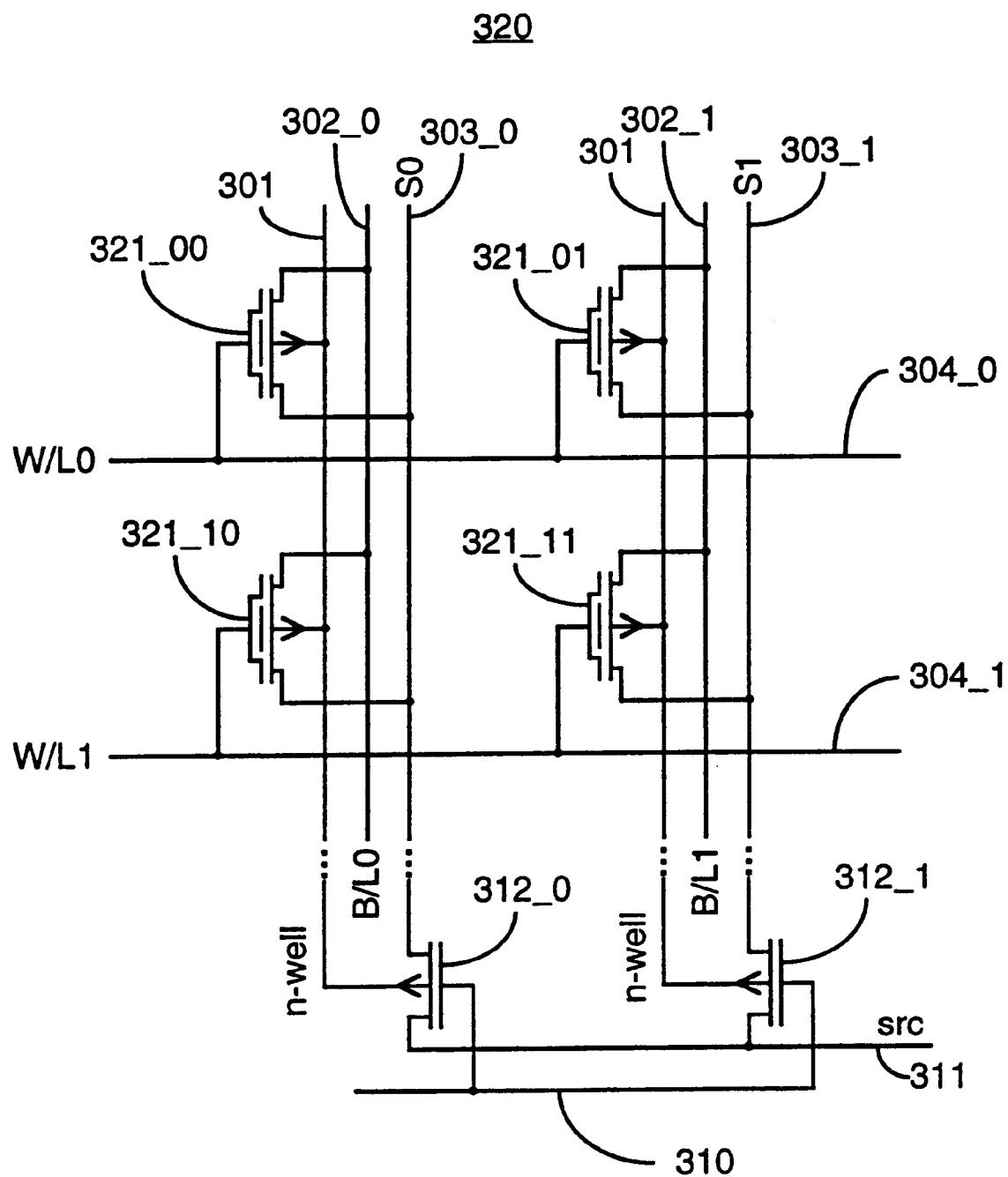
FIG. 21 shows schematically the cell arrangement in accordance with an alternate embodiment of the invention that merges the select and control gates.

Table 8 shows the biases applied in the various modes of operation of the array of FIG. 21. During programming, the word line for the block to be programmed is biased at $V_{PP}$ while the other word lines and the N well are biased at 0 V. The P+ junctions in the memory well are either grounded or allowed to float to avoid forward biasing the P+/N well junctions. The floating gates in the selected block are capacitively coupled to a high enough positive potential to cause electrons to tunnel from the accumulation layer formed in the underlying N well to the floating gates; this sets all of the cells in the selected block to the programmed state. To selectively erase cells within a selected block, the memory N well and all of the unselected word lines are biased at $V_{PP}$. The word line of the selected block is biased at ground. The bit lines of the cells that are selected to be erased are biased at $V_{PP}$; the other bit lines are biased at ground. Inversion layers of holes with potential equal to $V_{PP}$ form under to floating gates of the selected cells. Electrons tunnel from the floating gates to these inversion layers to erase the selected cells.

TABLE 8

| Signal | Read Mode 1 | Read Mode 2 | Program Mode | Erase Mode |
| --- | --- | --- | --- | --- |
| B/L0 | $V_{DD}$−1.5V | 1.5 V | 0 V | 0 V |
| B/L1 | $V_{DD}$−1.5V | 1.5 V | 0 V | $V_{PP}$ |
| W/L0 | 0 V | 0 V | $V_{PP}$ | 0 V |
| W/L1 | $V_{DD}$ | $V_{DD}$ | 0 V | $V_{PP}$ |
| S0 | $V_{DD}$ | 0 V | float | float |
| S1 | $V_{DD}$ | 0 V | float | float |
| Source select | 0 V | $V_{DD}$ | ≧ 0 V | $V_{PP}$ |
| Source memory N well | $V_{DD}$ $V_{DD}$ | 0 V $V_{DD}$ | 0 V 0 V | ≦ $V_{PP}$ $V_{PP}$ |

The appropriate read conditions depend upon the potentials on the programmed and erased gates and on the concentration of dopant under the floating gates. Because of the merger of the row and control lines, the control line must be biased at a potential more negative than $V_{DD}$ in order to bias the series transistors formed by the second layer of polysilicon into conduction. The requirement is that the programmed cells should conduct and the erased cells not conduct under the bias conditions applied to the selected row during read. The floating gate potential that will meet these requirements will depend on both the magnitude of $V_{DD}$ and the doping concentration under the floating gate, as is well known to those with ordinary skill in the art. The potential on the floating gate under read bias conditions can be changed by varying the value of $V_{PP}$ during program and erase. (It is convenient, but not necessary, to have the same value of $V_{PP}$ for both program and erase.) The biases shown in Table 8 for read mode 1 might be appropriate for an array that was to function with a relatively low value of $V_{DD}$, e.g. 2.5 V, such as might be found in many circuits with a scaled technology as well as in circuits intended for battery powered applications. In other circumstances with higher values of $V_{DD}$, it might be preferable to choose bias conditions shown in the column labeled read mode 2. In the case of biases shown for read mode 2, the source switches are-preferably implemented as N channel transistors. Those with ordinary skill in the art will know how to select appropriate read bias conditions for particular application cases.

Figures 22A, 22B:
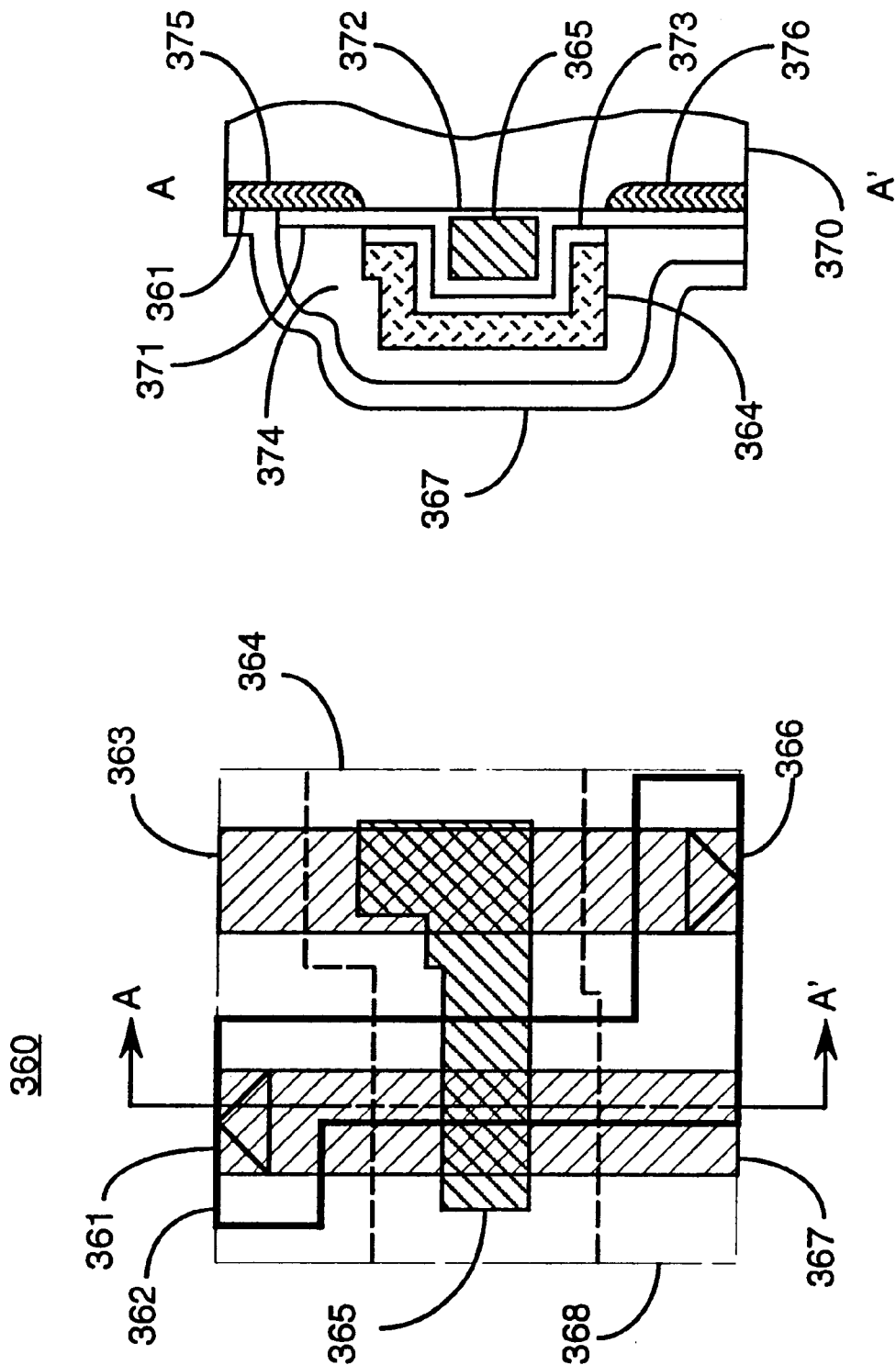
FIGS. 22a and 22b show the layout of an EEPROM cell suitable for use with the embodiment of this invention shown schematically in FIG. 21, implemented in a double layer poly, one level metal process.

FIG. 22*a* shows an example of a cell 360 laid out in conformance with the schematic of FIG. 21. The active region 362 traverses the cell in roughly the shape of a "Z". Contact 361 provides a connection from bit line 367 that runs through the cell as a metal 1 trace to the active region. Contact 366 provides a connection from column source 363 line that runs through the cell as a metal 1 trace in parallel with the bit line. Word line 364 runs through the cell in a horizontal manner as a second level polysilicon trace that is bounded by the two dashed lines. Floating gate 365 is formed in the first layer of polysilicon and is entirely covered by the word line.

FIG. 22*b* shows a cross section through the cell of FIG. 22*a* along the line A-A'. The entire array lies on an N well 370. There is a layer of $SiO_2$ that is thinner under floating gate 365 than elsewhere in the active region. This oxide layer is removed in the region of contact 361 to allow connection between metal trace 367 and the active region. Between this oxide layer and word line polysilicon 364 is a layer of silicon nitride 373 topped with a very thin layer of silicon dioxide, not shown. In one embodiment, the thickness of the oxide layer under the floating gate is in the range of approximately 5 to 15 nm and preferably in the range of approximately 7 to 10 nm, and the thickness of the oxide over the remainder of the active region is in the thickness range of approximately 10 to 40 nm and preferably in the range of approximately 15 to 25 nm. There is a layer of oxide on the sides and top of the floating gate under the nitride of similar thickness range to the thicker oxide on the active region. There is a layer of thermal $SiO_2$ topped by a thick layer of deposited silicon oxide or doped silicon oxide 374 lying over the cell under the metal 1 everywhere except in the contact region to provide a smoother surface on which to deposit the metal and to reduce the bit line capacitance. Two P+ regions 375 and 376 in the N well form the drain and source for the cell, respectively.

One embodiment of a process suitable for forming the structure shown in cross-section in FIG. 22 will now be described. After the N well is formed and the field oxide grown in one of several sequences well known to those with ordinary skill in the art, the thin tunnel oxide is grown over all of the active regions. The appropriate implants prior to the tunnel oxide growth are used to set the surface concentration of dopant in the channel to the desired range. Polysilicon then is deposited and doped N type to a concentration in the range of approximately $10^{19}$ to $10^{21}$ atoms/$cm^3$. Standard lithography and etching operations are used to form the polysilicon into the desired patterns for the floating gates. An oxide is then grown thermally on the polysilicon to a thickness that is preferentially in the range of approximately 10 to 15 nm. In the course of this oxidation, the oxide over the active regions will be thickened to the range of 15 to 25 nm depending on the details of the oxidation conditions. A layer of silicon nitride in the range 10 to 30 nm, preferably in the range 10–15 nm, is then deposited over the thermal oxide. A very thin layer of oxide is then formed on top of the nitride to a thickness in the range of approximately 4 to 6 nm.

At this time, the so called ONO (oxide-nitride-oxide) layer is masked and removed from regions of the wafer where thin gate oxide transistors that will be used in the peripheral circuitry are to be formed. The gate oxides for the peripheral transistors are grown after this without disturbing the ONO layer because the nitride oxidizes much more slowly than the silicon substrate. Another layer of polysilicon is deposited to form the gates of the peripheral transistors and the word line traces. This polysilicon layer is coated with photoresist and, after the usual exposure and develop operations, the polysilicon is etched into the desired patterns. While the resist remains upon the polysilicon, the nitride layer is removed from the regions in which it is exposed, if desired. Implants are now performed to provide the source and drains. (On some circuits the boron implant that forms the source/drain regions will also be used to dope the word line. On other circuits the polysilicon may be doped heavily enough before it is patterned to remain N type.) After the oxide is deposited, (and, if desired, flowed to further smooth the surface) contact holes are defined and metal is deposited and defined to form the interconnection traces.

Disclosed above was a non-volatile cell that withstands a high voltage applied to the source of a unselected cell without erasing as long as the source diffusion has only a lightly doped extension extending under the drain because high voltage will deplete the substrate under the floating gate with the consequence that there is a voltage drop across the depletion region that reduces the field across the gate oxide to a low enough value that there is no significant tunneling of electrons across the oxide. In accordance with this invention, a drain junction is provided that has the same characteristics. In this embodiment, the source and drain select transistors are omitted. The cell is programmed by biasing the control gate to a high voltage with the n-well at ground and other nodes either floating or at ground. The selected cells are erased by biasing the bit lines of the selected cells at VPP while the biases applied to the other cells in the array are such that the voltage across the gate oxide is maintain at a low enough voltage that significant tunneling does not occur.

Figure 23:
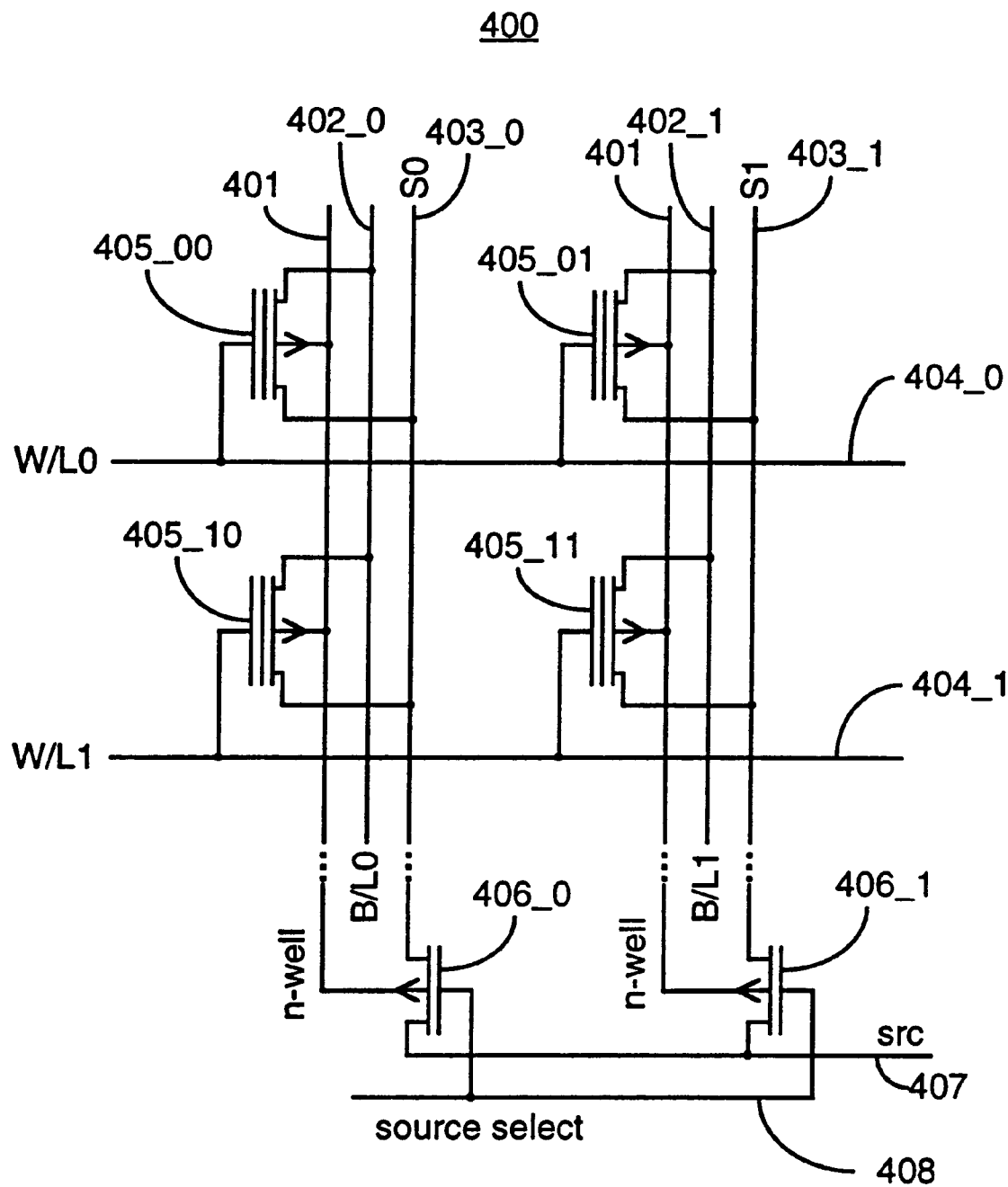
FIG. 23 is a schematic drawing of one embodiment of an array designed in accordance with this invention.

The symbols labeled 405-nm in FIG. 23 are intended to represent the merging of a capacitor and a floating gate transistor so that the center vertical line represents a conductor that is both the floating gate of the transistor and a plate of the capacitor to the control line which also serves as the word line. In the example shown in FIG. 24, the cell is implemented in a self-aligned two layer polysilicon process so that the symbol is a fairly accurate graphical representation through the memory device along the channel axis. This embodiment minimizes the cell area, but it will be clear to those with ordinary skill in the art that this cell can be implemented in other ways.

The cell is really a four terminal device with the N well, the row line (or word line), the bit line, and column source line being the four terminals. The N well is common to an entire array or a large block of an array to minimize array area. The column source lines and the bit lines are common to an entire column. The word line is common to the smallest block of cells that are to be selectively rewritten. If a byte alterable memory is desired, the word line is decoded to a single word in a manner well known to those with ordinary skill in the art. If byte writeability is not needed, the array area can be reduced by omitting the byte select transistors.

The operation of the array of FIG. 23 is shown in Table 9. Because this cell has no select gate in series with the memory transistor it is necessary that in the read mode this cell have a enhancement threshold with the word line in the unselected state in order that the current through the unselected cells not mask that through the selected cell. Therefore, in the read mode, a negative bias with respect to the source is applied to the selected word line to turn on the programmed transistors. The erased transistors must have a threshold that is positive enough that they not turn on even with a bias of $-V_{DD}$ (with respect to the source) applied to the word line. The bit line is set at about VDD - 1.5 V to provide a current for sensing.

To program the cell, i.e. to put electrons onto it so that it will conduct under read bias conditions, the n-well and the bit lines are grounded and the column source lines are allowed to float. The selected word line is biased at VPP so that electrons tunnel from an accumulation region under the floating gates onto the floating gates. The unselected word lines are at ground so that a field is not imposed on the unselected gates in addition to any fields arises from the charge trapped on the floating gate. Therefore, there are no significant tunneling currents on the unselected gates.

TABLE 9

| Signal | Read Mode | Program Mode | Erase Mode |
| --- | --- | --- | --- |
| B/L0 | $V_{DD}$ −1.5 V | 0 V | 0 V |
| B/L1 | $V_{DD}$ −1.5 V | 0 V | $V_{PP}$ |
| W/L0 | 0 V | $V_{PP}$ | 0 V |
| W/L1 | $V_{DD}$ | 0 V | $V_{PP}$ |
| S0 | $V_{DD}$ | float | float |
| S1 | $V_{DD}$ | float | float |
| Source Select | 0 V | $\geq$ 0 V | $V_{PP}$ |
| Source | $V_{DD}$ | 0 V | $\leq V_{PP}$ |
| memory N well | $V_{DD}$ | 0 V | $V_{PP}$ |

To erase selected cells, the selected word line is biased at ground and VPP is applied to the bit lines of the selected cells. (The memory well is biased at VPP during the erase mode in order that VPP can be applied to the selected bit lines.) An inversion layer of holes with potential equal to VPP forms under the selected floating gates that establishes a high enough field to cause electrons to tunnel from the floating gate to the inversion layer. The bit lines for the cells that are not to be erased are biased at 0 V. With the bit line and word line both at ground potential the cell on the selected word line that is not to be erased is not exposed to an externally applied field and there is no significant tunneling current.

During the erase mode, the unselected word lines are all biased at VPP. For the cells on the bit lines that are to be erased, there are not any externally applied fields because the word lines and bit lines are all at VPP. The cells on unselected word lines that are on bit lines that are not to erased present a case that deserves more consideration. For this case the N well and control gates are at VPP while the drains are at 0 V. If the floating gate overlaps a heavily doped drain region, a tunnel current will flow from the floating gate to the drain diffusion in a manner to the well known ETOX cell. However, if the drain extension under the floating gate is lightly enough doped, a depletion region will be established in the extension region and the voltage drop across the depletion region will screen the gate oxide from much of the applied voltage. This will suppress the tunneling current to acceptable levels. It is necessary to design the drain doping profile so that the desired depletion layer is established and so that the band-to-band tunneling, which causes current to flow from the drain the N well, is suppressed.

The band-to-band currents that do occur cause holes to be injected into the substrate. Diffusion will tend to distribute these holes throughout the N well. If any do accumulate under the floating gate, they will establish an electric field that will hasten the dispersal of the holes through the N well where they eventually recombine with the majority electrons.

Figure 24:
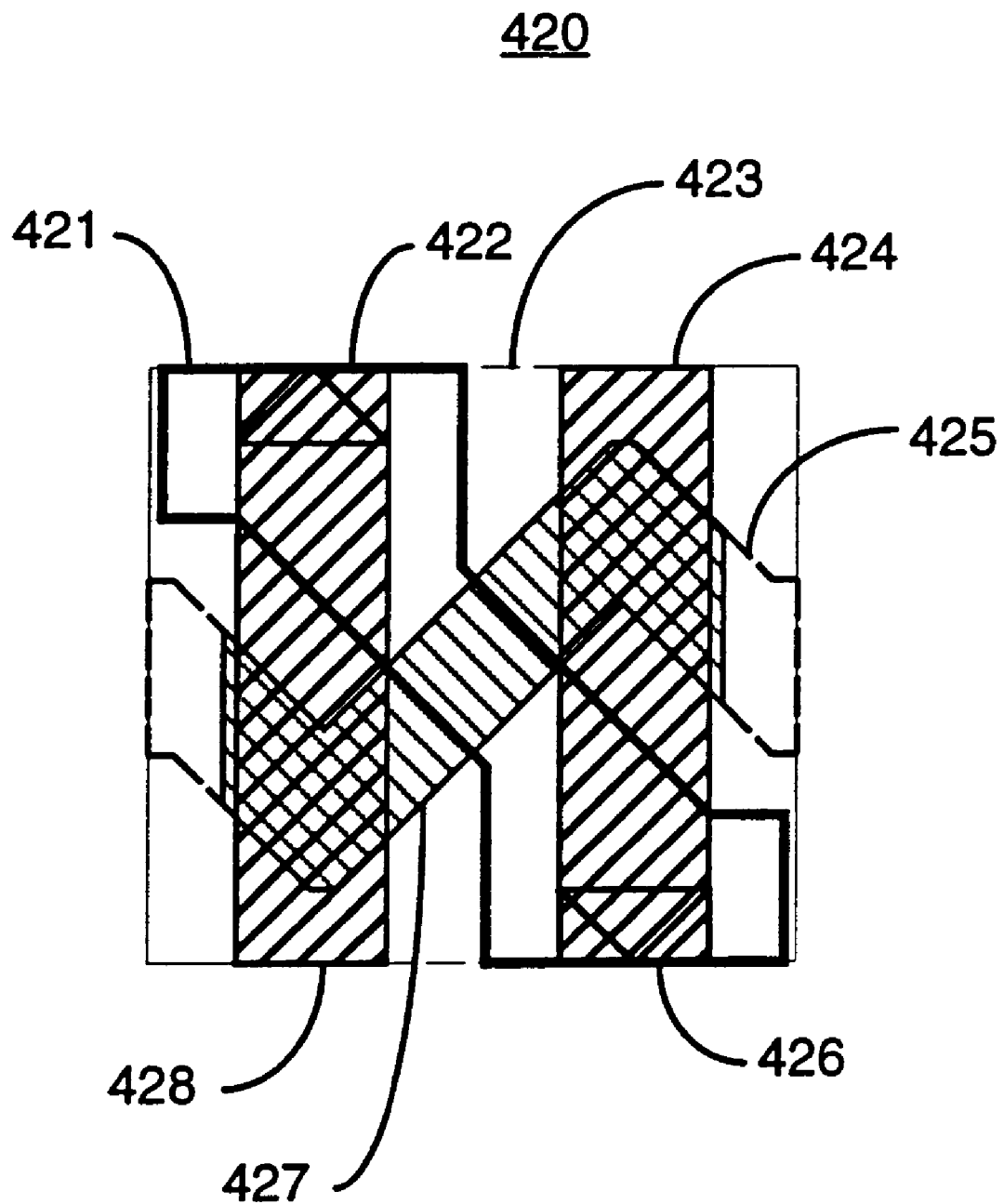
FIG. 24 shows the layout of an EEPROM cell suitable for use with the embodiment of this invention shown schematically in FIG. 23.

FIG. 24 shows the layout of one embodiment of this invention. This embodiment employs a two layer polysilicon process with a so-called stacked gate etch to produce a cell in which the floating gate and the word line polysilicon traces are self-aligned to each other perpendicular to the direction of current flow. In cell 420 shown in FIG. 24, contact 422 allows connection between bit line 428 which runs through the cell in metal 1 and active region 421. A metal 1 trace also is used to form the column source line which makes connection to active region 421 through contact opening 426. The top layer of polysilicon 425 zigzags through the cell from one edge to the other to form the word line. Floating gate 427 is formed in the first layer of polysilicon and is coincident with the polysilicon word line except at the two edges of the cell where the floating gate isolation occurs.

In one embodiment of a process to fabricate this cell, the field oxide for isolation and the N well are first formed. A sacrificial oxide is grown over the active region. With the aid of a photolithographic masking operation, the sacrificial oxide is selective removed from the region of the channel in which the floating gate transistor is to be formed and a thin oxide that will form the gate oxide for the cell is grown. The first layer of polysilicon is deposited and doped. With the aid of another photolithography operation, the polysilicon is selectively etched to form slots in the polysilicon over the field oxide which will later separate the floating gates on the same word line. As was described with respect to embodiment of FIG. 17, an ONO layer is formed next. This ONO layer is usually selectively removed from the regions of the wafer surface where the transistors for the peripheral circuitry are to be formed and the substrate is selectively prepared for the formation of the peripheral transistors by means of various oxidations and ion implantations, as is well-known to those with ordinary skill in the art.

After the necessary preparations for the peripheral transistors are completed, a second layer of polysilicon is deposited. Within the array area a masking operation is followed by a series of etching operations that define the second layer of polysilicon, the ONO stack and the first layer of polysilicon in succession with the same mask so the edges are coincident. The periphery area is usually covered during the stacked gate etch and etched in a separate process during which the array will be covered to prevent etching there while the poly in the periphery is defined.

To complete the array a very lightly doped boron drain implant (for example approximately $2 \times 10^{12}$ to $5 \times 10^{13}$ B/cm$^2$) is made and then, after a sidewall oxide is grown on the polysilicon gates, spacers are formed at the polysilicon sidewalls to prevent the source/drain implant from extending under the floating gate. A heavy dose (for example approximately 1 to $5 \times 10^{15}$ B/cm$^2$) implant is used to provide the doping for the array source/drain diffusions. (This implant also provides the dopant for the source/drain diffusions for the P channel transistors in the periphery. The dopant for the N channel peripheral transistors is usually arsenic and is usually implanted and annealed prior to the B source/drain implant.) After an anneal designed to minimize the diffusion of the boron, a dielectric is deposited to isolated to the metal 1 from the poly and active regions.

Contacts are selectively etched through the dielectrics overlying the active regions and polysilicon to provide connections were required. Finally metal 1 is deposited and patterned to complete the cell. Other layers of dielectrics and metals may be deposited and patterned to formed more layers of interconnections that are used to simplify the topology of the interconnections and compress the area that they occupy.

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed:

1. A method for operating a memory array arranged in a plurality of N rows and a plurality of M columns, said memory array comprising:

one or more source lines;

one or more source select lines;

a plurality of N control lines; and a plurality of N×M EEPROM cells, each uniquely associated with one of said rows and one of said columns, each of said EEPROM cells comprising:

a memory transistor formed in a memory well, said memory transistor comprising a source, a drain, a channel, and a floating gate;

a capacitor coupling between said control line and said floating gate of said memory transistor; and a source select transistor connected between said source of said memory transistor and its associated source line, and having a source select control gate connected to an associated one of said source select lines, said method comprising the steps of programming and erasing said EEPROM cells by tunneling of electrons between said floating gate and said channel, said tunneling being performed along substantially all of that portion of said channel which is located beneath said floating gate.

2. A memory array as in claim 1 wherein each of said EEPROM cells further comprises an access transistor connected between said drain of said memory transistor and said bit line, and having a control gate connected to said word line.

3. An EEPROM cell as in claim 1 further comprising a tunnel dielectric between the entire coextent of said channel and said floating gate.

4. A memory array as in claim 1, wherein each of said capacitors comprises an MOS transistor having its control gate serving as a first capacitor plate and connected to said floating gate of its associated memory transistor, and one or more source/drain regions and associated channel regions serving as a second capacitor plate and being coupled to associated one of said control lines.

5. A method for operating a memory array arranged in a plurality of N rows and a plurality of M columns, said memory array comprising:

a plurality of N source lines;

one or more source select lines;

a plurality of N control lines; and a plurality of N×M EEPROM cells, each uniquely associated with one of said rows and one of said columns, each of said EEPROM cells comprising:

a memory transistor formed in a memory well, said memory transistor comprising a source, a drain, a channel, and a floating gate;

a source select transistor connected between said source of said memory transistor and an associated one of said source lines, and having a source select control gate connected to an associated one of said source select lines; and a capacitor coupling between said associated one of said control lines and said floating gate of said memory transistor, said method comprising the steps of programming and erasing said EEPROM cells by tunneling of electrons between said floating gate and said channel, said tunneling being performed along substantially all of that portion of said channel which is located beneath said floating gate.

6. A memory array as in claim 5 wherein each of said EEPROM cells further comprises an access transistor connected between said drain of said memory transistor and an associated one of said bit lines, and having a control gate connected to said associated one of said word lines.

7. An EEPROM cell as in claim 5 further comprising a tunnel dielectric between the entire coextent of said channel and said floating gate.

8. A memory array as in claim 5, wherein each of said capacitors comprises an MOS transistor having its control gate serving as a first capacitor plate and coupled to said floating gate of its associated memory transistor, and one or more source/drain regions and associate channel inversion regions serving as a second capacitor plate and being coupled to said associated one of said control lines.

9. A method for operating a memory array arranged in a plurality of N rows and a plurality of M columns, said memory array comprising:

a plurality of N source lines;

one or more source select lines;

a plurality of M control lines; and a plurality of N×M EEPROM cells, each uniquely associated with one of said rows and one of said columns, each of said EEPROM cells comprising:

a memory transistor formed in a memory well, said memory transistor comprising a source, a drain, a channel, and a floating gate;

a source select transistor connected between said source of said memory transistor and an associated one of said source lines, and having a source select control gate connected to an associated one of said source select lines; and a capacitor coupling between said associated one of said control lines and said floating gate of said memory transistor, said method comprising the steps of programming and erasing said EEPROM cells by tunneling of electrons between said floating gate and said channel, said tunneling being performed along substantially all of that portion of said channel which is located beneath said floating gate.

10. A memory array as in claim 9 wherein each of said EEPROM cells further comprises an access transistor connected between said drain of said memory transistor and an associated one of said bit lines, and having a control gate connected to said associated one of said word lines.

11. An EEPROM cell as in claim 9 further comprising a tunnel dielectric between the entire coextent of said channel and said floating gate.

12. A memory array as in claim 9, wherein each of said capacitors comprises an MOS transistor having its control gate serving as a first capacitor plate and coupled to said floating gate of its associated memory transistor, and one or more source/drain regions and associate channel inversion regions serving as a second capacitor plate and being coupled to associated one of said control lines.

13. A method for operating a memory array arranged in a plurality of N rows and a plurality of M columns, said memory array comprising:

a plurality of N control lines; and a plurality of N×M EEPROM cells, each uniquely associated with one of said rows and one of said columns, each of said EEPROM cells comprising:

a memory transistor formed in a memory well, said memory transistor comprising a source, a drain, and a floating gate; and a capacitor coupling between said control line and said floating gate of said memory transistor; and a tunnel dielectric between the entire coextent of said channel and said floating gate, said method comprising the steps of programming said EEPROM cells by tunneling of electrons between said floating gate and said channel, said tunneling being performed along substantially all of that portion of said channel which is located beneath said floating gate.

14. A memory array as in claim 13 wherein each of said EEPROM cells further comprises an access transistor connected between said drain of said memory transistor and said bit line, and having a control gate connected to said word line.

15. A memory array as in claim 13 further comprising a plurality of source select transistors, each associated with one of said bit lines, each connected between said sources of said memory transistors associated with said bit line and said source line, and having a source select control gate connected to an associated one of said source select lines.

16. A memory array as in claim 15, wherein each of said capacitors comprises an MOS transistor having its control gate serving as a first capacitor plate and connected to said floating gate of its associated memory transistor, and one or more source/drain regions and associate channel inversion regions serving as a second capacitor plate and being coupled to associated one of said control lines.

17. A memory array as in claim 15 wherein each of said EEPROM cells further comprises an access transistor connected between said drain of said memory transistor and an associated one of said bit lines, and having a control gate connected to said associated one of said word lines.

18. A method for operating a memory array arranged in a plurality of N rows and a plurality of M columns, said memory array comprising:

a plurality of M source lines;

one or more source select lines;

a plurality of N control lines; and a plurality of N×M EEPROM cells, each uniquely associated with one of said rows and one of said columns, each of said EEPROM cells comprising:

a memory transistor formed in a memory well, said memory transistor comprising a source, a drain, and a floating gate;

a capacitor coupling between said associated one of said control lines and said floating gate of said memory transistor; and a source select transistor connected between said source of said memory transistor and its associated source line, and having a source select control gate connected to an associated one of said source select lines, said method comprising the steps of programming and erasing said EEPROM cells by tunneling of electrons between said floating gate and said channel, said tunneling being performed along substantially all of that portion of said channel which is located beneath said floating gate.

19. A memory array as in claim 18 wherein each of said EEPROM cells further comprises an access transistor connected between said drain of said memory transistor and an associated one of said bit lines, and having a control gate connected to said associated one of said word lines.

20. An EEPROM cell as in claim 18 further comprising a tunnel dielectric between the entire coextent of said channel and said floating gate.

21. A memory array as in claim 18, wherein each of said capacitors comprises an MOS transistor having its control gate serving as a first capacitor plate and coupled to said floating gate of its associated memory transistor, and one or more source/drain regions and associate channel inversion regions serving as a second capacitor plate and being coupled to associated one of said control lines.

22. A method as in claim 13 in which the tunnel dielectric extends over the entire coextent of said channel and said floating gate.

* * * * *